US012660345B2

(12) United States Patent
Murakami

(10) Patent No.: US 12,660,345 B2
(45) Date of Patent: Jun. 16, 2026

(54) LIGHT RECEIVING ELEMENT, PHOTODETECTOR, ELECTRONIC APPARATUS, AND METHOD OF MANUFACTURING LIGHT RECEIVING ELEMENT

(71) Applicant: SONY SEMICONDUCTOR SOLUTIONS CORPORATION, Kanagawa (JP)

(72) Inventor: Hiroaki Murakami, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 349 days.

(21) Appl. No.: 18/551,215

(22) PCT Filed: Jan. 21, 2022

(86) PCT No.: PCT/JP2022/002080
§ 371 (c)(1),
(2) Date: Sep. 19, 2023

(87) PCT Pub. No.: WO2022/209194
PCT Pub. Date: Oct. 6, 2022

(65) Prior Publication Data
US 2024/0170509 A1      May 23, 2024

(30) Foreign Application Priority Data
Mar. 30, 2021      (JP) .................................. 2021-057406

(51) Int. Cl.
$H10F$ 39/00          (2025.01)
$H10F$ 39/12          (2025.01)

(52) U.S. Cl.
CPC ..... *H10F 39/80373* (2025.01); *H10F 39/014* (2025.01); *H10F 39/802* (2025.01); *H10F 39/811* (2025.01)

(58) Field of Classification Search
CPC ............. H10F 39/80373; H10F 39/014; H10F 39/802; H10F 39/811; H10F 30/20;
(Continued)

(56) References Cited

U.S. PATENT DOCUMENTS

| | | | | |
|---|---|---|---|---|
| 8,471,313 B2 * | 6/2013 | Takahashi | ............. | H10F 39/803 |
| | | | | 257/292 |
| 11,322,533 B2 * | 5/2022 | Yamakawa | ............. | H04N 25/63 |
| 2016/0020237 A1 * | 1/2016 | Yamakawa | ............. | H04N 25/63 |
| | | | | 257/233 |

FOREIGN PATENT DOCUMENTS

| | | |
|---|---|---|
| JP | 2013-098446 A | 5/2013 |
| JP | 2019-050424 A | 3/2019 |

(Continued)

OTHER PUBLICATIONS

International Search Report and Written Opinion of PCT Application No. PCT/JP2022/002080, issued on Apr. 5, 2022, 11 pages of ISRWO.

*Primary Examiner* — David Vu
(74) *Attorney, Agent, or Firm* — CHIP LAW GROUP

(57)          ABSTRACT

Provided is a light receiving element capable of improving a transfer failure in a structure in which a photoelectric converter is embedded. A light receiving element includes a photoelectric conversion region of a first conductivity type, a well region of a second conductivity type provided on a side of one surface of the photoelectric conversion region, a floating diffusion region of the first conductivity type provided on a side of a one surface of the well region opposite to the photoelectric conversion region, a transfer gate electrode that is embedded in a depth direction of the well region (Continued)

with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

16 Claims, 19 Drawing Sheets

(58) Field of Classification Search
CPC .. H10F 39/12; H10F 39/8037; H10F 39/8033; H04N 25/76
See application file for complete search history.

(56) References Cited

FOREIGN PATENT DOCUMENTS

| JP | 2019-145544 A | 8/2019 |
| JP | 2019-169668 A | 10/2019 |
| JP | 2020-047616 A | 3/2020 |
| JP | 2021-048241 A | 3/2021 |
| WO | 2020/137370 A1 | 7/2020 |

* cited by examiner

LIGHT RECEIVING ELEMENT, PHOTODETECTOR, ELECTRONIC APPARATUS, AND METHOD OF MANUFACTURING LIGHT RECEIVING ELEMENT

CROSS REFERENCE TO RELATED APPLICATIONS

This application is a U.S. National Phase of International Patent Application No. PCT/JP2022/002080 filed on Jan. 21, 2022, which claims priority benefit of Japanese Patent Application No. JP 2021-057406 filed in the Japan Patent Office on Mar. 30, 2021. Each of the above-referenced applications is hereby incorporated herein by reference in its entirety.

TECHNICAL FIELD

The technology of the present disclosure (present technology) relates to a light receiving element, a photodetector, an electronic apparatus, and a method of manufacturing the light receiving element.

BACKGROUND ART

As a solid-state imaging device which is one conventional photodetector, there is known a structure in which a photoelectric converter constituting a photodiode is embedded at a position deeper than a pixel transistor and a floating diffusion region (floating diffusion) (see Patent Document 1). In a structure in which the photoelectric converter is embedded, a p-well region having a high impurity concentration is provided to separate the photoelectric converter from the pixel transistor and the floating diffusion region, and signal charges (electrons) photoelectrically converted by the photoelectric converter are read by a vertical transfer gate electrode embedded in the p-well region.

CITATION LIST

Patent Document

Patent Document 1: Japanese Patent Application Laid-Open No. 2019-145544

SUMMARY OF THE INVENTION

Problems to be Solved by the Invention

However, in a structure in which the photoelectric converter is embedded, when signal charges are read by the transfer gate electrode, a potential of a side wall of the transfer gate electrode is constricted (a transfer barrier is increased) by the p-well region having a high impurity concentration, and a transfer failure may occur.

An object of the present technology is to provide a light receiving element, a photodetector, an electronic apparatus, and a method of manufacturing the light receiving element capable of improving a transfer failure in a structure in which a photoelectric converter is embedded.

Solutions to Problems

A light receiving element according to an aspect of the present technology includes a photoelectric conversion region of a first conductivity type, a well region of a second conductivity type provided on a side of one surface of the photoelectric conversion region, a floating diffusion region of the first conductivity type provided on a side of a one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

A photodetector according to an aspect of the present technology includes a pixel region including a plurality of pixels arranged in a matrix, in which each of the plurality of pixels includes a photoelectric conversion region of a first conductivity type, a well region of a second conductivity type provided on a side of one surface of the photoelectric conversion region, a floating diffusion region of a first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

An electronic apparatus according to an aspect of the present technology includes a photodetector having a pixel region including a plurality of pixels arranged in a matrix, and a signal processing circuit that processes an output signal of the photodetector, in which each of the plurality of pixels includes a photoelectric conversion region of a first conductivity type, a well region of a second conductivity type provided on a side of one surface of the photoelectric conversion region, a floating diffusion region of a first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

A method of manufacturing a light receiving element according to an aspect of the present technology includes forming a well region of a second conductivity type on a side of one surface of a photoelectric conversion region of a first conductivity type, forming a floating diffusion region of the first conductivity type on a side of one surface of a well region of the well region opposite to the photoelectric conversion region, embedding a transfer gate electrode that transfers a signal charge photoelectrically converted in the photoelectric conversion region to the floating diffusion region in a depth direction of the well region with a gate insulating film interposed therebetween, and embedding an auxiliary electrode that extends toward a side surface of the transfer gate electrode in the well region with the gate insulating film interposed therebetween.

BRIEF DESCRIPTION OF DRAWINGS

FIG. 21 is a diagram illustrating an example of a schematic configuration of an endoscopic surgery system.

FIG. 23 is a block diagram illustrating an example of a schematic configuration of a vehicle control system.

MODE FOR CARRYING OUT THE INVENTION

First to fifth embodiments of the present technology will be described below with reference to the drawings. Reference will be made in the following description. The same or similar parts are denoted by the same or similar reference signs. It should be noted that the drawings are schematic, and a relationship between a thickness and a planar dimension, a ratio of thicknesses between layers and the like are different from actual ones. Therefore, specific thicknesses and dimensions should be determined in consideration of the following description. Furthermore, it goes without saying that dimensional relationships and ratios are partly different between the drawings. Note that the effects described in this specification are merely examples and are not limited, and other effects may be provided.

In this specification, a "first conductivity type" means one of a p-type or an n-type, and a "second conductivity type" means one of the p-type or the n-type different from the "first conductivity type". Furthermore, "n" or "p" to which "+" or "−" is added means a semiconductor region having a relatively higher or lower impurity concentration than that of a semiconductor region to which "+" or "−" is not added. However, even in the semiconductor regions to which the same "n" and "n" are added, it does not mean that the impurity concentrations of the semiconductor regions are exactly the same.

The definitions of directions such as "up" and "down" in this specification are merely defined for convenience of description, and do not limit the technical idea of the present technology. It is obvious that, for example, when a target is rotated by 90° and observed, the "up" and "down" are read as converted to "left" and "right", and when the target is rotated by 180° and observed, the "up" and "down" are read as inverted.

First Embodiment

<Schematic Configuration Example of Solid-State Imaging Device>

Figure 1:
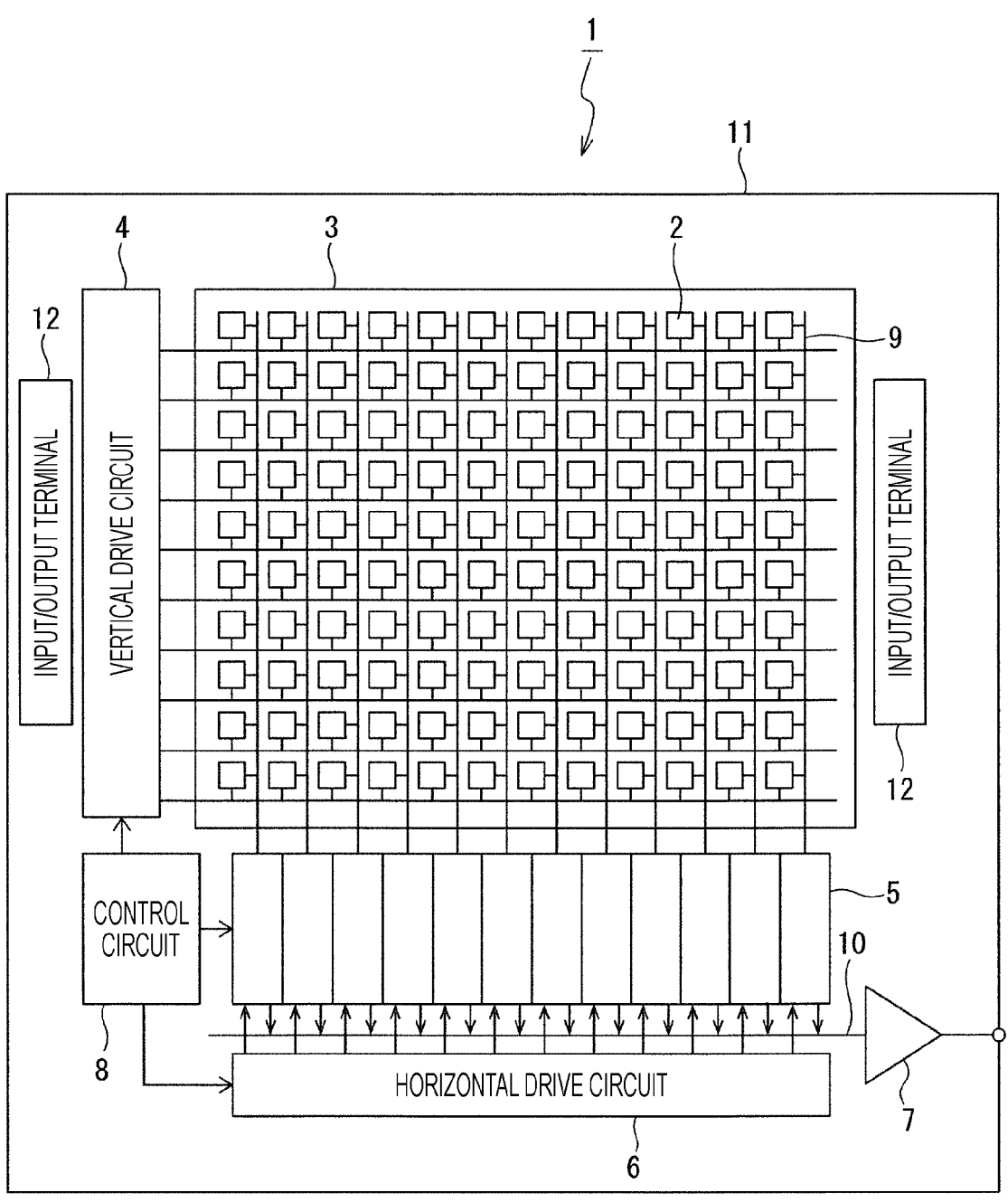
FIG. 1 is a block diagram of a solid-state imaging device according to a first embodiment.

A complementary metal oxide semiconductor (CMOS) image sensor will be described as an example of a solid-state imaging device which is an example of a photodetector according to a first embodiment. As illustrated in FIG. 1, a solid-state imaging device 1 according to the first embodiment includes a pixel region (imaging region) 3 in which a plurality of pixels 2 each including a photoelectric conversion element is regularly arranged two-dimensionally (in a matrix) on a semiconductor substrate 11 such as a silicon substrate, for example, and a peripheral circuit unit (4, 5, 6, 7, 8) that controls the pixel region 3 and processes a pixel signal output from the pixel region 3.

The pixel 2 includes, for example, a photodiode, and includes the photoelectric conversion element that photoelectrically converts incident light, and a plurality of pixel transistors (MOS transistors) for reading signal charges generated by photoelectric conversion in the photoelectric conversion element. The plurality of pixel transistors can include three transistors of a transfer transistor, a reset transistor, and an amplification transistor, for example. The plurality of pixel transistors can include four transistors by adding a selection transistor. An equivalent circuit of a unit pixel is similar to a general equivalent circuit. The pixel 2 can also have a shared pixel structure. The shared pixel structure includes a plurality of photodiodes, a plurality of transfer transistors, one shared floating diffusion, and one each of other shared pixel transistors.

The peripheral circuit unit (4, 5, 6, 7, 8) includes a vertical drive circuit 4, a column signal processing circuit 5, a horizontal drive circuit 6, an output circuit 7, and a control circuit 8. The control circuit 8 receives an input clock and data giving a command of an operation mode and the like and outputs data of internal information and the like of the solid-state imaging device 1. For example, the control circuit 8 generates a clock signal and a control signal serving as references for operations of the vertical drive circuit 4, the column signal processing circuit 5, the horizontal drive circuit 6, and the like on the basis of a vertical synchronization signal, a horizontal synchronization signal, and a master clock signal. The control circuit 8 outputs the generated clock signal and control signal to the vertical drive circuit 4, the column signal processing circuit 5, the horizontal drive circuit 6, and the like.

The vertical drive circuit 4 includes, for example, a shift register. The vertical drive circuit 4 selects a pixel drive wiring, supplies a pulse for driving the pixels 2 to the selected pixel drive wiring, and drives the pixels 2 row by row. For example, the vertical drive circuit 4 selectively scans each pixel 2 of the pixel region 3 in a vertical direction sequentially row by row, and supplies a pixel signal based on a signal charge generated in accordance with an amount of light received in, for example, the photodiode to be a photoelectric converter of each pixel 2 through a vertical signal line 9 to the column signal processing circuit 5.

The column signal processing circuit 5 is arranged for every column of the pixels 2, for example. The column signal processing circuit 5 performs signal processing such as noise removal on the signals output from the pixels 2 of one row for every pixel column. For example, the column signal processing circuit 5 performs signal processing such as correlated double sampling (CDS) for removing fixed pattern noise unique to the pixel 2, signal amplification, and analog to digital (AD) conversion. A horizontal selection switch (not shown) is provided at an output stage of the column signal processing circuit 5 so as to be connected with a horizontal signal line 10.

The horizontal drive circuit 6 includes, for example, a shift register. The horizontal drive circuit 6 sequentially outputs horizontal scanning pulses and sequentially selects each of the column signal processing circuits 5 to cause each of the column signal processing circuits 5 to output a pixel signal to the horizontal signal line 10.

The output circuit 7 performs signal processing on signals sequentially supplied from each of the column signal processing circuits 5 through the horizontal signal line 10 and outputs processed signals. For example, the output circuit 7 may perform only buffering, or may also perform black level adjustment, column variation correction, various digital signal processing, and the like. An input/output terminal 12 exchanges signals with the outside.

In FIG. 1, the pixel region 3 and the peripheral circuit unit (4, 5, 6, 7, 8) of the solid-state imaging device 1 according to the first embodiment are formed on one semiconductor substrate 11, but may be formed in a stacked structure in which a plurality of substrates is bonded. For example, the solid-state imaging device 1 according to the first embodiment may include first and second substrates, the photoelectric converter and the pixel transistor may be provided on the first substrate, and the peripheral circuit (3, 4, 5, 6, 7) or the like may be provided on the second substrate. Alternatively, the photoelectric converter and a part of the pixel transistor may be provided on the first substrate, and the remaining part of the pixel transistor, the peripheral circuit (3, 4, 5, 6, 7), and the like may be provided on the second substrate.

<Schematic Configuration Example of Pixel>

Figure 2:
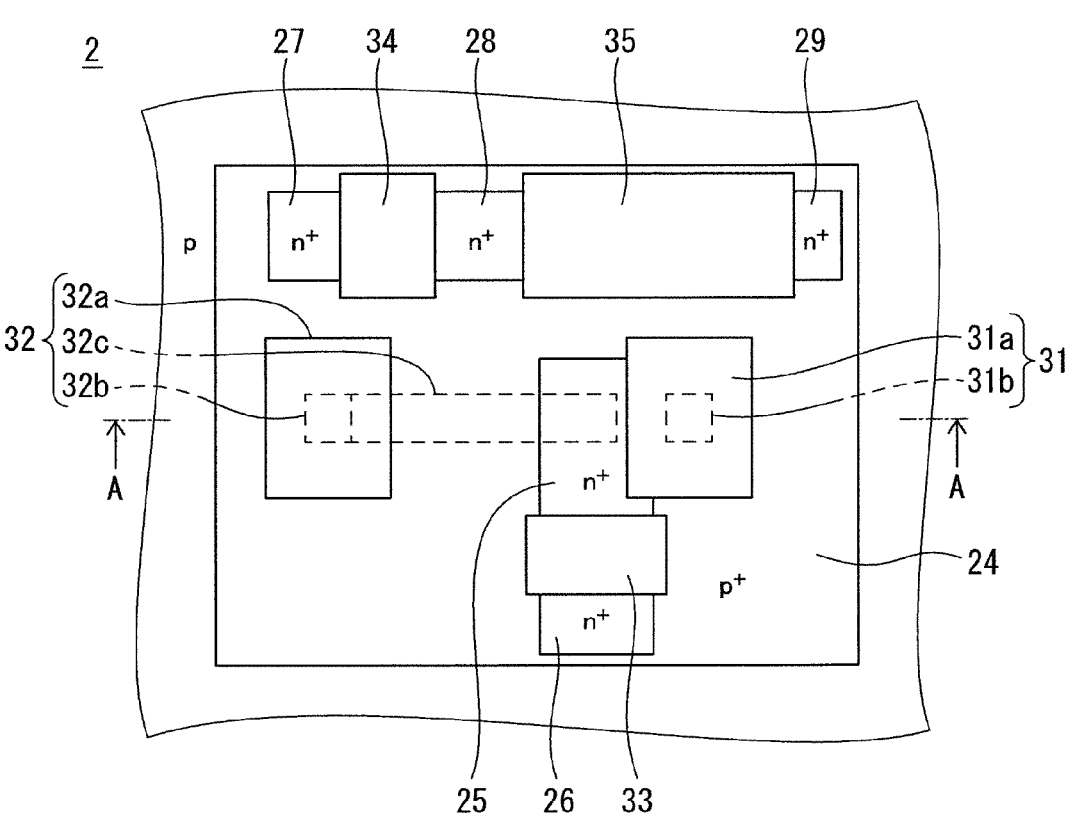
FIG. 2 is a plan view of a pixel according to the first embodiment.
Figure 3:
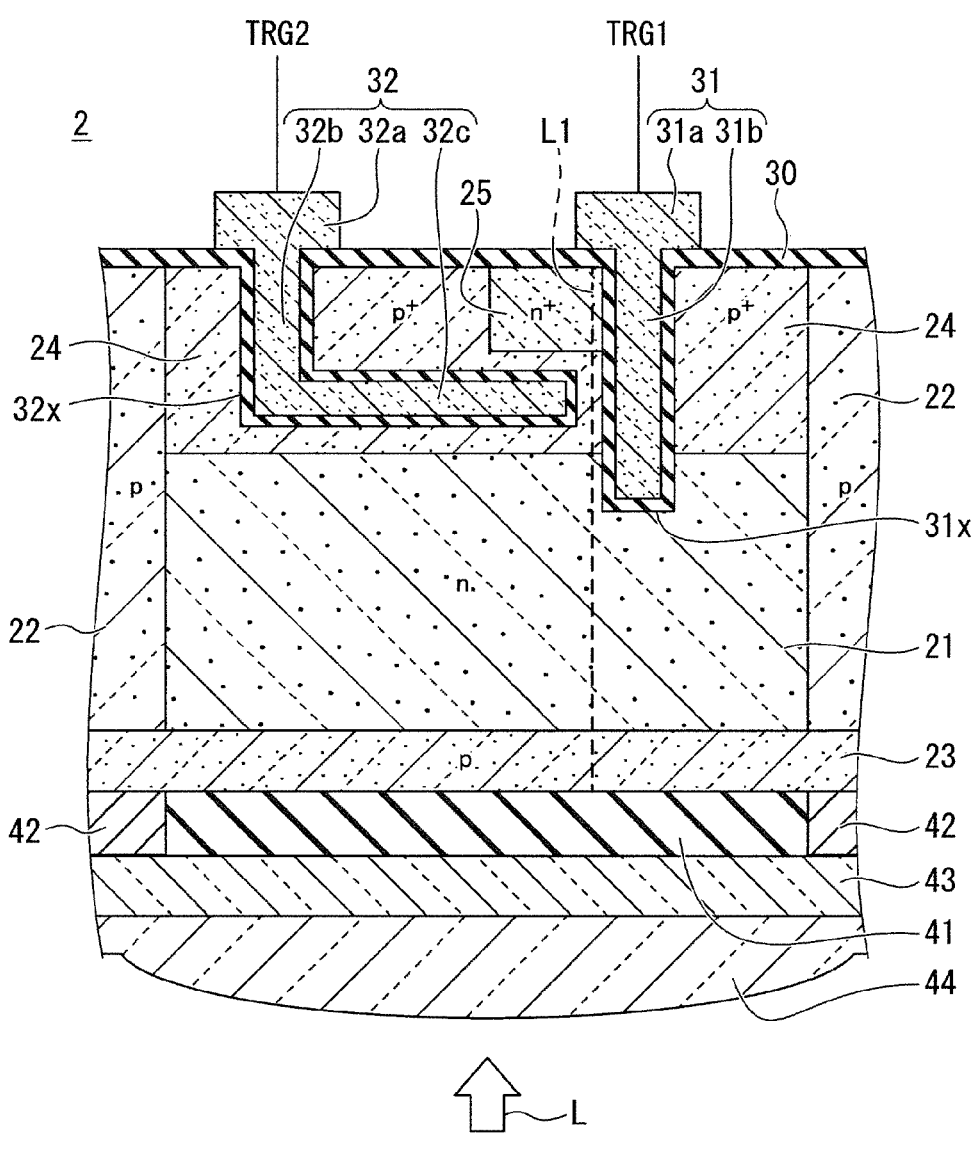
FIG. 3 is a sectional view when viewed from an A-A direction in FIG. 2.

FIG. 2 illustrates a schematic planar layout of the pixel 2 illustrated in FIG. 1. The pixels 2 illustrated in FIG. 2 are arranged in a matrix to constitute the entire pixel region 3 illustrated in FIG. 1. FIG. 3 is a sectional view when viewed from an A-A direction in FIG. 2. As illustrated in FIG. 3, a so-called back-illuminated solid-state imaging device is exemplified as the solid-state imaging device 1 according to the first embodiment. Hereinafter, a surface on an incident surface side of a light L (lower side in FIG. 3) of each member of the solid-state imaging device 1 according to the first embodiment is referred to as a "back surface", and a surface on a side opposite to the incident surface side of a light L (upper side in FIG. 3) of each member of the solid-state imaging device 1 according to the first embodiment is referred to as a "front surface".

As illustrated in FIG. 3, the pixel (light receiving element) 2 of the solid-state imaging device 1 according to the first embodiment includes a photoelectric conversion region 21 of the first conductivity type (n-type). A semiconductor material constituting the photoelectric conversion region 21 is, for example, silicon (Si), but a compound semiconductor can also be used. Examples of the compound semiconductor include indium gallium arsenide (InGaAs), indium gallium arsenide phosphide (InGaAsP), indium arsenide antimony (InAsSb), indium gallium phosphide (InGaP), gallium arsenide antimony (GaAsSb), indium aluminum arsenide (InAlAs), gallium nitride (GaN), silicon carbide (SiC), and silicon germanium (SiGe).

A well region 24 of the second conductivity type ($p^+$ type) is provided in a part of a front surface side (upper part) of the photoelectric conversion region 21. A floating diffusion region (floating diffusion) 25 of the first conductivity type ($n^+$ type) having a higher impurity concentration than the photoelectric conversion region 21 is provided in a part of the front surface side (upper part) of the well region 24. The well region 24 has a function of isolating the photoelectric conversion region 21 on a back surface side of the well region 24 from the floating diffusion region 25 and the pixel transistor on the front surface side of the well region 24. Signal charges (electrons) photoelectrically converted by the photoelectric conversion region 21 are transferred to the floating diffusion region 25.

A second conductivity type (p-type) element isolation region 22 having a lower impurity concentration than the well region 24 is provided on side surfaces of the photoelectric conversion region 21 and the well region 24. The element isolation region 22 has a function of isolating the pixel 2 from other pixels. In addition, the element isolation region 22 constitutes a photodiode which is a photoelectric converter by a pn junction with the $n^+$-type photoelectric conversion region 21. Furthermore, the element isolation region 22 has a function of suppressing dark current.

A trench 31$x$ is provided so as to penetrate the well region 24 and reach the photoelectric conversion region 21 in a depth direction (vertical direction) of the well region 24. A side surface of the trench 31$x$ is in contact with the floating diffusion region 25, the well region 24, and the photoelectric conversion region 21. A vertical transfer gate electrode 31 is embedded in the trench 31$x$ with a gate insulating film 30 interposed therebetween. The transfer gate electrode 31 includes a protrusion 31$a$ protruding from the front surface of the well region 24, and a columnar embedded region 31$b$ connected to the protrusion 31$a$, embedded in the trench 31$x$, and extending in the depth direction.

When the signal charges of the pixel 2 are read, a positive potential is applied to the transfer gate electrode 31 as a control signal TRG1. As a result, the potential of the well region 24 near a side surface of the embedded region 31$b$ of the transfer gate electrode 31 is modulated to form a channel region, and the signal charges (electrons) photoelectrically converted in the photoelectric conversion region 21 are transferred to the floating diffusion region 25 via the channel region. On the other hand, when the signal charges of the pixel 2 are accumulated, a negative potential is applied to the transfer gate electrode 31 as the control signal TRG1. As a result, a channel region is not formed in the well region 24 near the side surface of the embedded region 31*b* of the transfer gate electrode 31, and the signal charges are not transferred to the floating diffusion region 25.

In the well region 24, a trench 32*x* having an L-shaped cross section is provided apart from the trench 31*x*. The trench 32*x* is apart from the floating diffusion region 25 and is in contact with the well region 24. An auxiliary electrode 32 having an L-shaped cross section is embedded in the trench 32*x* with the gate insulating film 30 interposed therebetween. The auxiliary electrode 32 includes a protrusion 32*a* protruding from the front surface of the well region 24, and a first embedded region 32*b* and a second embedded region 32*c* connected to the protrusion 32*a* and embedded in the trench 32*x*. The first embedded region 32*b* extends in the depth direction of the well region 24. One end of the second embedded region 32*c* is connected to an end in a depth direction of the first embedded region 32*b*. The second embedded region 32*c* extends in a direction (horizontal direction) orthogonal to the depth direction of the well region 24 toward the side surface of the embedded region 31*b* of the transfer gate electrode 31. The other end of the second embedded region 32*c* is located immediately below the floating diffusion region 25 and near the side surface of the embedded region 31*b* of the transfer gate electrode 31.

In FIG. 2, a planar pattern of the embedded region 31*b* embedded in the well region 24 of the transfer gate electrode 31 is schematically indicated by a broken line. In addition, planar patterns of the first embedded region 32*b* and the second embedded region 32*c* embedded in the well region 24 of the auxiliary electrode 32 are schematically indicated by broken lines. On the planar patterns, the second embedded region 32*c* extends linearly toward the embedded region 31*b*, and an end (end surface) of the second embedded region 32*c* faces the side surface of the embedded region 31*b*.

Note that a positional relationship, shapes, and sizes of the embedded region 31*b* of the transfer gate electrode 31, and the first embedded region 32*b* and the second embedded region 32*c* of the auxiliary electrode 32 are not limited to those exemplified in FIG. 2. For example, in FIG. 2, a case is exemplified where the embedded region 31*b* of the transfer gate electrode 31 and the first embedded region 32*b* of the auxiliary electrode 32 are rectangular on the planar pattern, but the embedded region 31*b* and the first embedded region 32*b* may be a circle, a polygon other than a rectangle, or the like. In addition, on the planar pattern, a side surface near the end of the second embedded region 32*c* of the auxiliary electrode 32 may face the side surface of the embedded region 31*b* of the transfer gate electrode 31.

The auxiliary electrode 32 has functions such as a function of assisting transfer of signal charges by the transfer gate electrode 31 by applying a voltage to the well region 24 in which the channel region near a side wall of the transfer gate electrode 31 is formed and locally modulating the potential of the well region 24. Since a periphery of the auxiliary electrode 32 is surrounded by the well region 24, an influence of the potential on the periphery can be minimized.

The transfer gate electrode 31 and the auxiliary electrode 32 are connected to different driving circuits (not shown). The control signal TRG1 and a control signal TRG2 are individually and independently applied to the transfer gate electrode 31 and the auxiliary electrode 32, respectively. The control signal TRG1 and the control signal TRG2 may have the same potential or different potentials. For example, the potential of the control signal TRG2 may be an intermediate potential lower than the potential of the control signal TRG1. The control signal TRG1 and the control signal TRG2 may be applied simultaneously or at different timings. Note that a common transfer control wiring may be connected to the transfer gate electrode 31 and the auxiliary electrode 32, and the control signal TRG1 which is a common potential may be simultaneously applied to the transfer gate electrode 31 and the auxiliary electrode 32.

As a material of the gate insulating film 30, a single-layer film of any one of a silicon oxide film ($SiO_2$ film), a silicon oxynitride film (SiON film), a strontium oxide film (SrO film), a silicon nitride film ($Si_3N_4$ film), an aluminum oxide film ($Al_2O_3$ film), a magnesium oxide film (MgO film), an yttrium oxide film ($Y_2O_3$ film), a hafnium oxide film ($HfO_2$ film), a zirconium oxide film ($ZrO_2$ film), a tantalum oxide film ($Ta_2O_5$ film), a bismuth oxide film ($Bi_2O_3$ film), or a composite film obtained by laminating a plurality of the above films, or the like can be used. As a material of the transfer gate electrode 31 and the auxiliary electrode 32, for example, polysilicon (doped polysilicon) to which an n-type impurity or a p-type impurity is added at a high concentration can be used.

As illustrated in FIG. 2, the well region 24 is defined by the element isolation region 22. Diffusion regions 26, 27, 28, and 29 of the first conductivity type ($n^+$ type) are provided on the front surface side of the well region 24. A gate electrode 33 of the reset transistor is provided on the front surface of the semiconductor substrate between the floating diffusion region 25 and the diffusion region 26 with a gate insulating film (not shown) interposed therebetween. A gate electrode 34 of the selection transistor is provided on the front surface of the semiconductor substrate between the floating diffusion region 27 and the diffusion region 28 with a gate insulating film (not shown) interposed therebetween. A gate electrode 35 of the amplification transistor is provided on the front surface of the semiconductor substrate between the floating diffusion region 28 and the diffusion region 29 with a gate insulating film (not shown) interposed therebetween.

Although not illustrated in FIGS. 2 and 3, an interlayer insulating film is disposed on the front surface of the well region 24 so as to cover the transfer gate electrode 31, the auxiliary electrode 32, the gate electrode 33 of the reset transistor, the gate electrode 34 of the selection transistor, and the gate electrode 35 of the amplification transistor. In the interlayer insulating film, a wiring layer for reading signal charges generated in the photoelectric converter is formed. The arrangement position and the number of the wiring layers are not limited. A support substrate including a Si substrate or the like may be disposed on the front surface of the interlayer insulating film.

As illustrated in FIG. 3, a semiconductor region 23 of the second conductivity type (p-type) is provided on the back surface side of the photoelectric conversion region 21. The p-type semiconductor region 23 functions as a photodiode which is a photoelectric converter by a pn junction with the $n^+$-type photoelectric conversion region 21. Furthermore, the semiconductor region 23 has a function of suppressing dark current.

A light shielding film 42 is disposed on a part of the back surface side of the semiconductor region 23. The light shielding film 42 is selectively disposed so as to open a light receiving surface of the photoelectric converter. As a material of the light shielding film 42, for example, a metal material such as aluminum (Al), tungsten (W), copper (Cu), or chromium (Cr), or a dielectric material such as polysilicon can be adopted.

On the back surface side of the semiconductor region 23, a planarization film 41 is disposed so as to be adjacent to the light shielding film 42. As a material of the planarization film 41, silicon oxide, silicon nitride, silicon oxynitride, organic spin-on glass (SOG), polyimide resin, fluorine resin, or the like can be used.

A color filter 43 is disposed on the back surface side of the planarization film 41 and the light shielding film 42. The color filter 43 can include, as its material, an organic material-based material layer using an organic compound such as a pigment or a dye. The color filter 43 transmits a predetermined wavelength component of the incident light L.

On the back surface side of the color filter 43, an on-chip lens 44 is disposed. The on-chip lens 44 condenses the incident light L. As a material of the on-chip lens 44, for example, an insulating material such as silicon oxide, silicon nitride, silicon oxynitride, organic SOG, polyimide resin, or fluorine resin can be used.

Since the solid-state imaging device 1 according to the first embodiment is a back-illuminated type, the light L enters from the side of the on-chip lens 44. The incident light L passes through the on-chip lens 44, the color filter 43, and the planarization film 41, and is incident on the photoelectric conversion region 21. The photoelectric conversion region 21 photoelectrically converts the incident light L by a photodiode configured together with the element isolation region 22, the semiconductor region 23, and the like, and generates signal charges (electrons) according to the amount of light.

Note that, as the solid-state imaging device 1 according to the first embodiment, a so-called back-illuminated solid-state imaging device has been exemplified, but the solid-state imaging device can also be applied to a so-called front-illuminated solid-state imaging device. In a case of a front-illuminated solid-state imaging device, it is sufficient that a color filter or an on-chip lens is provided on the front surface side of an interlayer insulating film constituting a multilayer wiring structure provided on the front surface side of a photoelectric converter, and light is incident on the front surface side of the photoelectric converter through the multilayer wiring structure.

Figure 4:
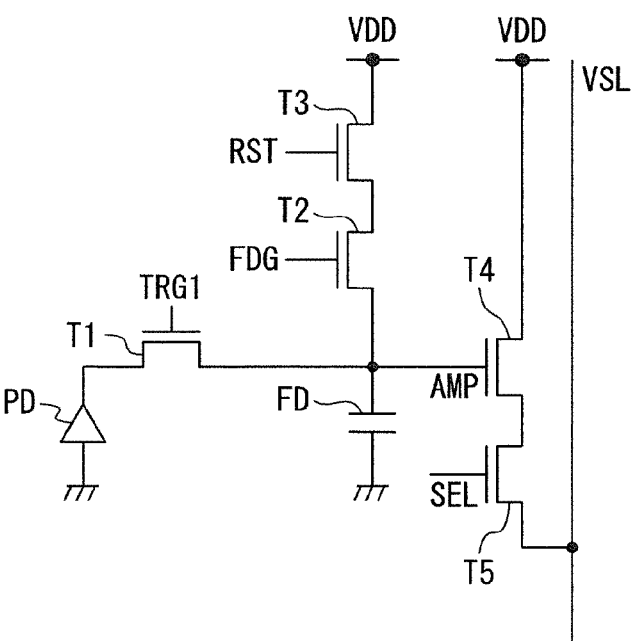
FIG. 4 is an equivalent circuit diagram of the pixel according to the first embodiment.

FIG. 4 illustrates an example of an equivalent circuit diagram of the pixel 2 of the solid-state imaging device 1 according to the first embodiment. As illustrated in FIG. 4, an anode of a photodiode PD is grounded, and a source of a transfer transistor T1 is connected to a cathode of the photodiode PD. A floating diffusion region (floating diffusion) FD is connected to a drain of the transfer transistor T1. The photodiode PD in FIG. 4 includes the photoelectric conversion region 21, the element isolation region 22, the semiconductor region 23, and the like in FIG. 3. The transfer transistor T1 in FIG. 4 includes the transfer gate electrode 31, the well region 24, and the like in FIG. 3. The floating diffusion region FD in FIG. 4 includes the floating diffusion region 25 in FIG. 3.

The floating diffusion region FD in FIG. 4 is connected to a source of a conversion efficiency switching transistor T2 and a gate of an amplification transistor T4. A drain of the conversion efficiency switching transistor T2 is connected to a source of a reset transistor T3. A drain of the reset transistor T3 is connected to a power supply VDD. The reset transistor T3 in FIG. 4 includes the gate electrode 33, the floating diffusion region 25, the diffusion region 26, and the like in FIG. 2. The amplification transistor T4 in FIG. 4 includes the gate electrode 35, the diffusion regions 28 and 29, and the like in FIG. 2. Although not illustrated in FIG. 2, the conversion efficiency switching transistor T2 in FIG. 4 is provided similarly to the other pixel transistors. Note that the conversion efficiency switching transistor T2 is not necessarily provided, and the floating diffusion region FD may be connected to the source of the reset transistor T3.

The source of the amplification transistor T4 in FIG. 4 is connected to a drain of a selection transistor T5, and a drain of the amplification transistor T4 is connected to the power supply VDD. A source of the selection transistor T5 is connected to a vertical signal line VSL. A selection signal SEL of a horizontal line is supplied from a vertical shift register to a gate of the selection transistor T5. The selection transistor T5 in FIG. 4 includes the gate electrode 34, the diffusion regions 27 and 28, and the like in FIG. 2.

Comparative Example

Figure 5:
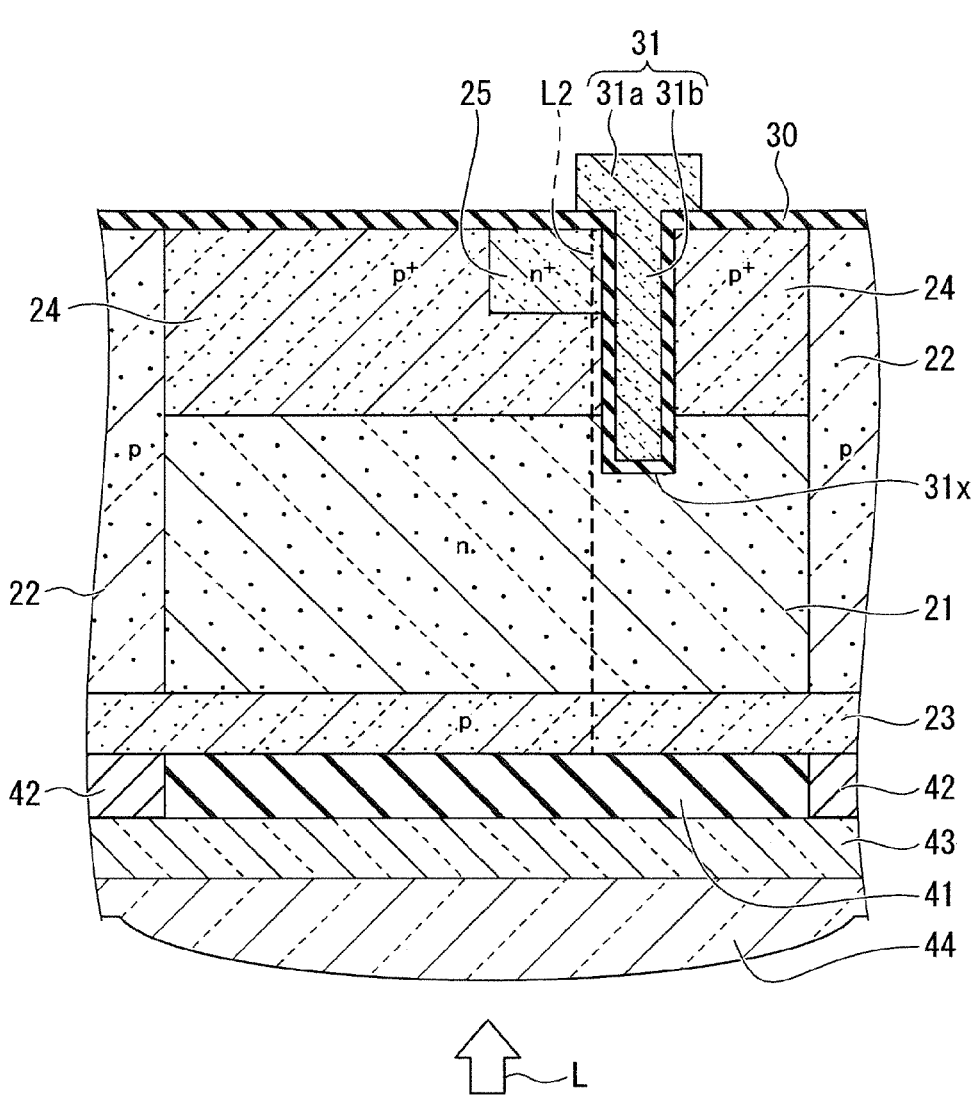
FIG. 5 is a sectional view of a pixel according to a comparative example.

Here, pixels of a solid-state imaging device according to a comparative example will be described with reference to FIGS. 5 and 6. As illustrated in FIG. 5, the pixel of the solid-state imaging device according to the comparative example is different from the pixel 2 of the solid-state imaging device 1 according to the first embodiment illustrated in FIG. 3 in that the auxiliary electrode 32 is not provided.

Figure 6:
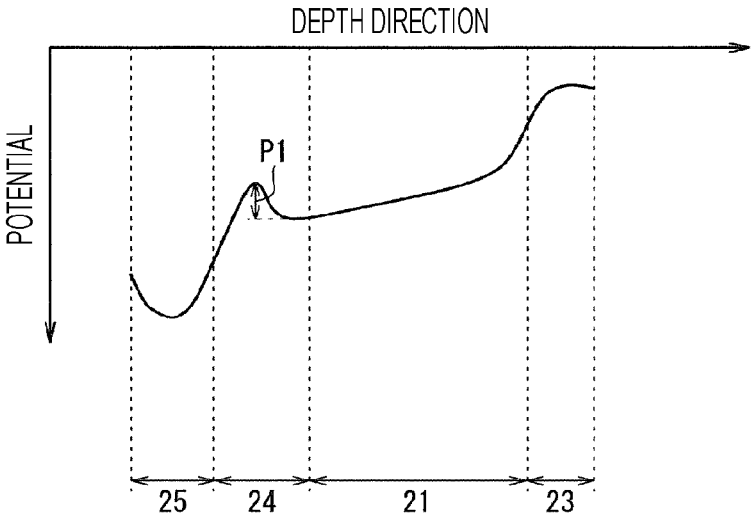
FIG. 6 is a graph illustrating a potential distribution in a depth direction of the pixel according to the comparative example.

FIG. 6 illustrates a potential distribution of a portion of a virtual straight line L2 passing through the floating diffusion region 25, the well region 24, the photoelectric conversion region 21, and the semiconductor region 23 illustrated in FIG. 5 when a positive potential is applied to the transfer gate electrode 31 to turn on the transfer gate electrode 31 at the time of reading signal charges in the pixel of the solid-state imaging device according to the comparative example. As illustrated in FIG. 6, in the pixel of the solid-state imaging device according to the comparative example, the potential is constricted by the $p^+$-type well region 24 having a high impurity concentration, and a transfer barrier P1 located in the well region 24 tends to be high. As a result, there is a concern that transfer by the transfer gate electrode 31 is deteriorated.

In addition, the $p^+$-type well region 24, which is formed by ion-implanting a high-concentration p-type impurity, is susceptible to variations in a dose amount and variations in a line width and misalignment of an ion implantation mask. Therefore, during accumulation of signal charges, when a negative potential is applied to the transfer gate electrode 31 to turn off the transfer gate electrode 31, an overflow barrier (OFB) is formed at the position of the well region 24, and robustness of the number of saturated electrons by the overflow barrier is easily affected.

On the other hand, in the pixel 2 of the solid-state imaging device 1 according to the first embodiment illustrated in FIG. 3, at the time of reading signal charges, a positive potential is applied to the transfer gate electrode 31 to turn on the transfer gate electrode 31, and a positive potential is also applied to the auxiliary electrode 32 to locally modulate the potential of the well region 24 near the side wall of the transfer gate electrode 31 via the auxiliary electrode 32. As a result, the transfer barrier P1 illustrated in FIG. 6 formed in the pixel of the solid-state imaging device according to the comparative example can be crushed and lowered, and transfer can be improved. That is, the potential distribution of the portion of the virtual straight line L1 passing through the floating diffusion region 25, the well region 24, the photoelectric conversion region 21, and the semiconductor region 23 in the pixel 2 of the solid-state imaging device 1 according to the first embodiment illustrated in FIG. 3 is a distribution in which the transfer barrier P1 is crushed and lowered in a potential profile illustrated in FIG. 6.

On the other hand, during accumulation of signal charges, a negative potential is applied to the transfer gate electrode 31 to turn off the transfer transistor, and voltage is applied by the auxiliary electrode 32. Therefore, the potential of the well region 24 near the side wall of the transfer gate electrode 31 can be locally modulated via the auxiliary electrode 32, the height of the overflow barrier at the position of the well region 24 can be controlled, and the overflow barrier can be optimized. That is, instead of adjusting the impurity concentration of the well region 24 by ion implantation so as to minimize the influence on the potential around the auxiliary electrode 32, the auxiliary electrode 32 enables the potential to be adjusted with an arbitrary voltage to improve transfer characteristics and saturation characteristics. In addition, by adjusting the value of the potential applied to the auxiliary electrode 32 individually for every pixel, individual optimization can be performed even if shading or in-plane dependency occurs.

<Read Operation of Solid-State Imaging Device>

Next, an example of a read operation of the solid-state imaging device 1 according to the first embodiment will be described with reference to each reference sign illustrated in the equivalent circuit in FIG. 4 and a timing chart in FIG. 7.

At time t1, by setting the selection signal SEL applied to the gate of the selection transistor T5 to a high (H) level, the selection transistor T5 is turned on. At time t2, by setting a switching signal FDG applied to a gate of the conversion efficiency switching transistor T2 to an H level, the conversion efficiency switching transistor T2 is turned on.

From time t3 to t4, by setting a reset signal RST applied to a gate of the reset transistor T3 to the H level, the reset transistor T3 is turned on, and the signal charges accumulated in the floating diffusion region FD is reset. A period from time t4 to time t5 is called a P-phase, and is a period in which the floating diffusion region FD becomes a reference potential after a noise reset.

From time t5 to t6, by setting the control signal TRG1 applied to a gate of the transfer transistor T1 to the H level, the transfer transistor T1 is turned on, and the signal charges (electrons) photoelectrically converted by the photodiode PD are transferred to the floating diffusion region FD. A potential AMP by the signal charges transferred to the floating diffusion region FD is applied to the gate of the amplification transistor T4, and a current amplified by the amplification transistor T4 flows through the vertical signal line VSL. A period from time t5 to t6 is called a D-phase, and is a period in which the potential of the floating diffusion region FD becomes a potential including the read signal charges. A difference between the reference potential of the floating diffusion region FD in the P-phase and the potential of the floating diffusion region FD in the D-phase is a signal output.

From time t5 to t6, the control signal TRG1 applied to the gate of the transfer transistor T1 is set to the H level, and at the same time, the control signal TRG2 applied to the auxiliary electrode 32 is set to the H level. As a result, a voltage can be locally applied to the channel region formed by the transfer transistor T1, and a transfer failure can be improved. Since the control signal TRG2 can be set separately from the control signal TRG1, for example, the potential of the control signal TRG2 may be set to a potential (intermediate potential) lower than the potential of the control signal TRG1.

<Method of Manufacturing Solid-State Imaging Device>

Next, an example of a method of manufacturing the solid-state imaging device according to the first embodiment will be described with reference to FIGS. 8 to 15. Note that the method of manufacturing the solid-state imaging device according to the first embodiment is not limited to the procedure described below, and various procedures can be adopted.

Figure 8:
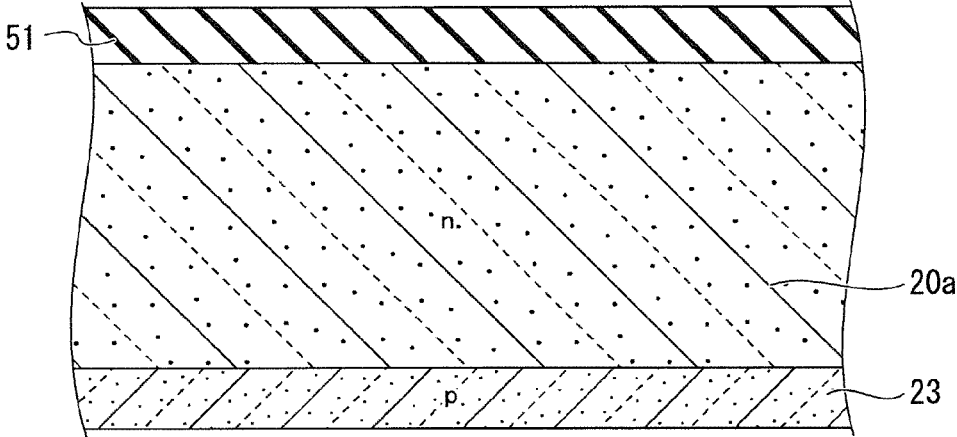
FIG. 8 is a sectional view of a method of manufacturing the pixel according to the first embodiment.

First, an n-type semiconductor substrate 20a is prepared, and the p-type semiconductor region 23 is formed on the back surface side of the semiconductor substrate 20a by ion implantation and heat treatment. Next, as illustrated in FIG. 8, an insulating film 51 including an oxide film or the like is formed on the front surface side of the semiconductor substrate 20a by a chemical vapor deposition (CVD) method, a thermal oxidation method, or the like.

Figure 9:
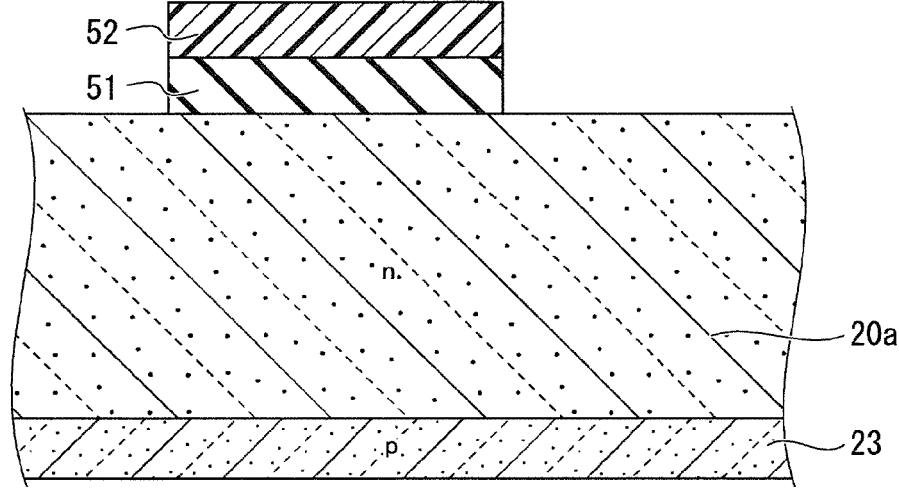
FIG. 9 is a sectional view following FIG. 8 of the method of manufacturing the pixel according to the first embodiment.

Next, a photoresist film 52 is applied to the front surface side of the insulating film 51, and the photoresist film 52 is patterned by a photolithography technique. As illustrated in FIG. 9, a part of the insulating film 51 is selectively removed by dry etching using the patterned photoresist film 52 as a mask. Thereafter, the photoresist film 52 is removed.

Figure 10:
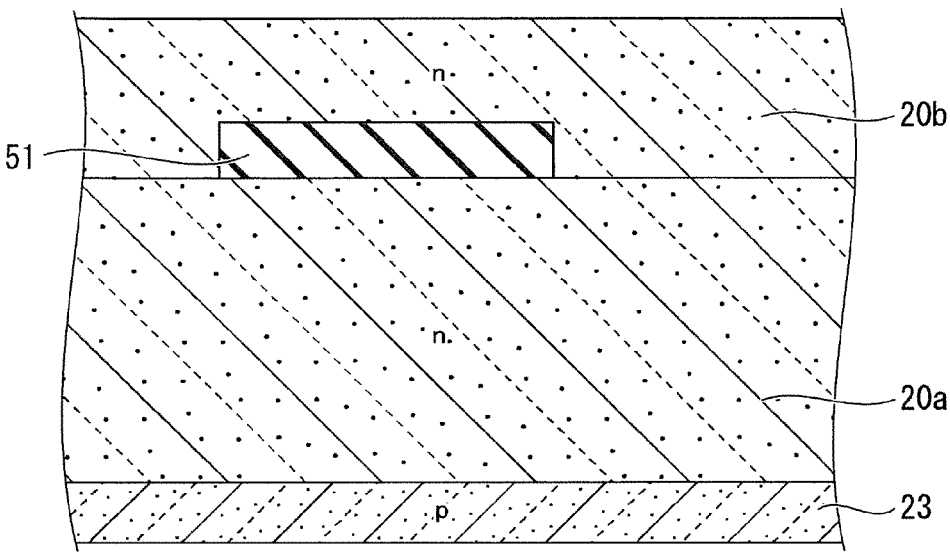
FIG. 10 is a sectional view following FIG. 9 of the method of manufacturing the pixel according to the first embodiment.

Next, as illustrated in FIG. 10, an n-type semiconductor layer 20b is epitaxially grown on the front surface side of the semiconductor substrate 20a. As a result, the insulating film 51 is embedded in the semiconductor layer 20b.

Figure 11:
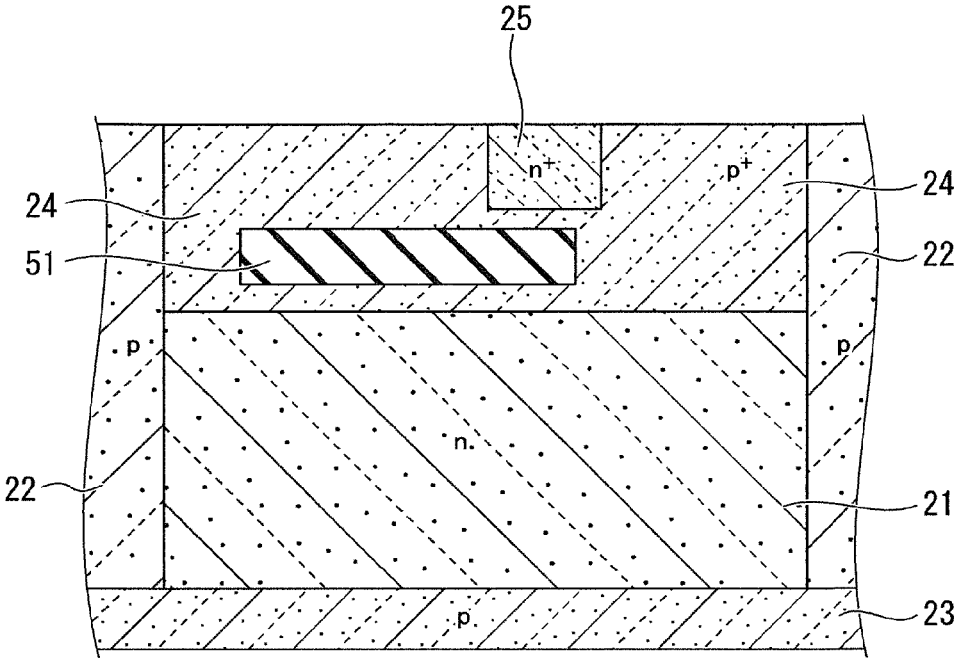
FIG. 11 is a sectional view following FIG. 10 of the method of manufacturing the pixel according to the first embodiment.

Next, an ion implantation mask is sequentially formed by the photolithography technique, and a p-type impurity and an n-type impurity are sequentially ion-implanted. Thereafter, impurity ions are diffused and activated by performing heat treatment, and as illustrated in FIG. 11, the $p^+$-type well region 24 is formed so as to embed the insulating film 51 therein. Furthermore, the $n^+$-type floating diffusion region 25 is formed on a part of the front surface side of the well region 24, and the p-type element isolation region 22 is formed on the side surface of the well region 24. The photoelectric conversion region 21 is defined in the semiconductor substrate 20a under the well region 24. At this time, the $n^+$-type diffusion regions 26 to 29 illustrated in FIG. 2 are also formed.

Figure 12:
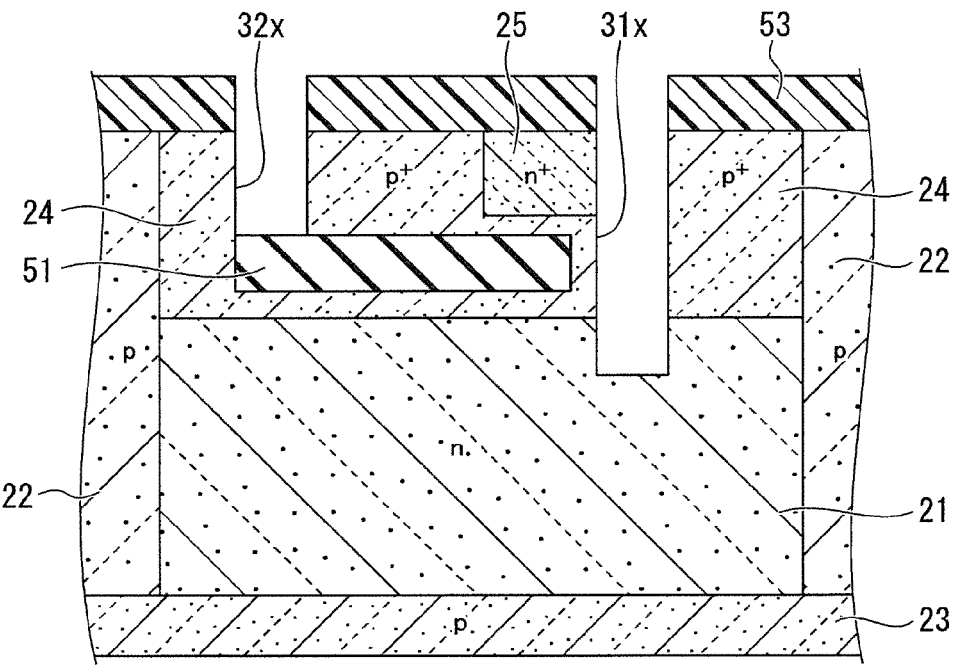
FIG. 12 is a sectional view following FIG. 11 of the method of manufacturing the pixel according to the first embodiment.

Next, as illustrated in FIG. 12, a photoresist film 53 is applied to the front surface side of the well region 24, and the photoresist film 53 is patterned by the photolithography technique. By using the patterned photoresist film 53 as a mask, the well region 24 is removed in the depth direction by dry etching to simultaneously form the trenches 31x and 32x. The trench 31x is formed so as to penetrate the well region 24 in the depth direction and reach the photoelectric conversion region 21. The trench 32x is formed so as to expose the front surface of the insulating film 51. Thereafter, the photoresist film 53 is removed.

Figure 13:
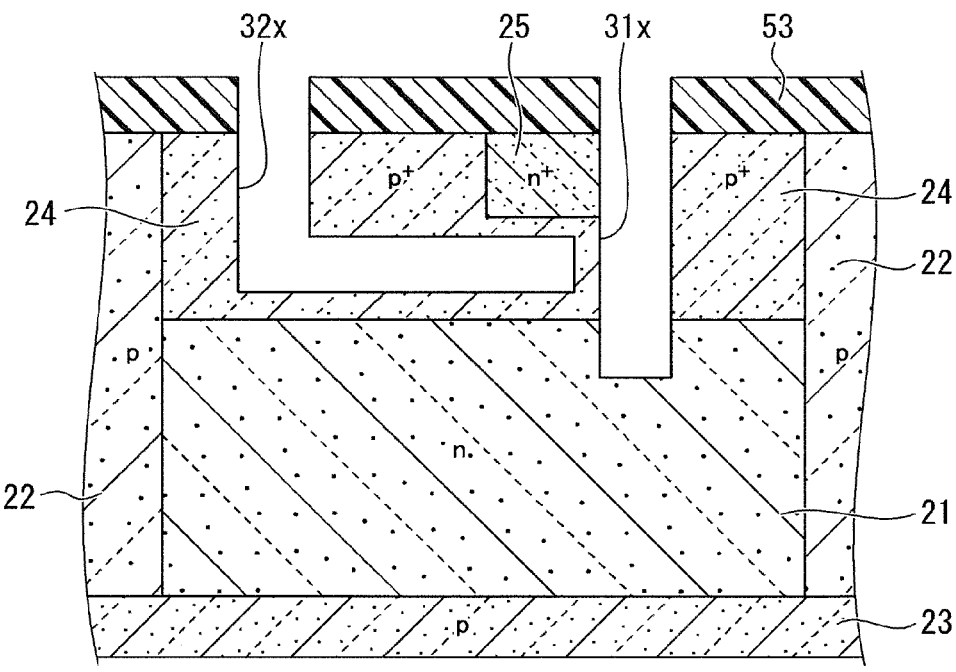
FIG. 13 is a sectional view following FIG. 12 of the method of manufacturing the pixel according to the first embodiment.

Next, the insulating film 51 is removed by wet etching or the like, and the trench 32x is expanded in a direction orthogonal to the depth direction of the well region 24 as illustrated in FIG. 13. At this time, since a defect tends to remain around an extended portion of the trench 32x, the extended portion of the trench 32x is formed so as to be apart from a portion where the channel region of the well region 24 is formed and the floating diffusion region 25.

Figure 14:
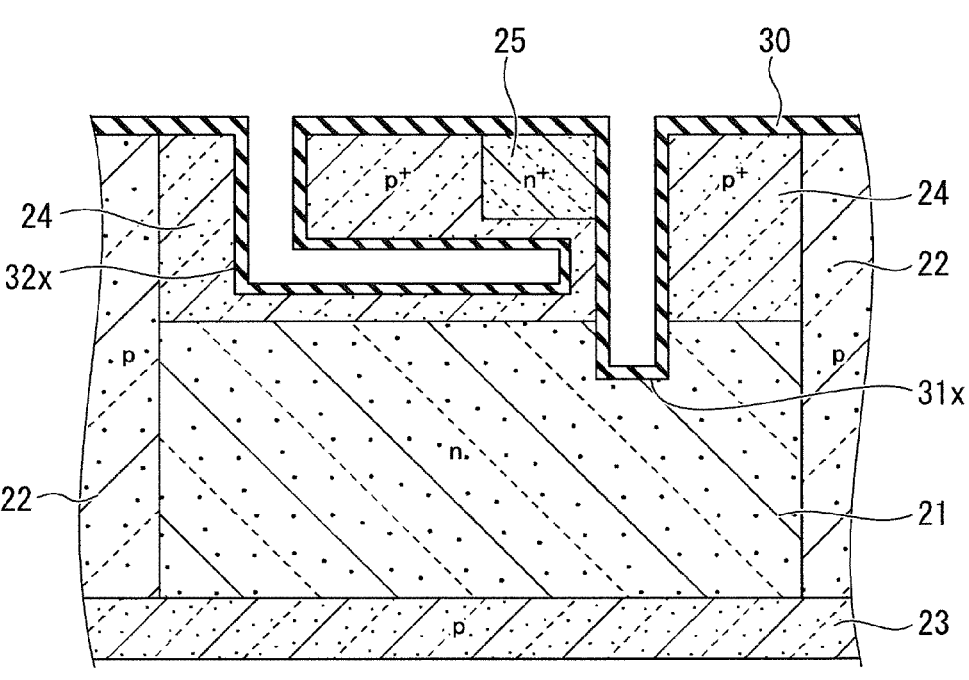
FIG. 14 is a sectional view following FIG. 13 of the method of manufacturing the pixel according to the first embodiment.
Figure 15:
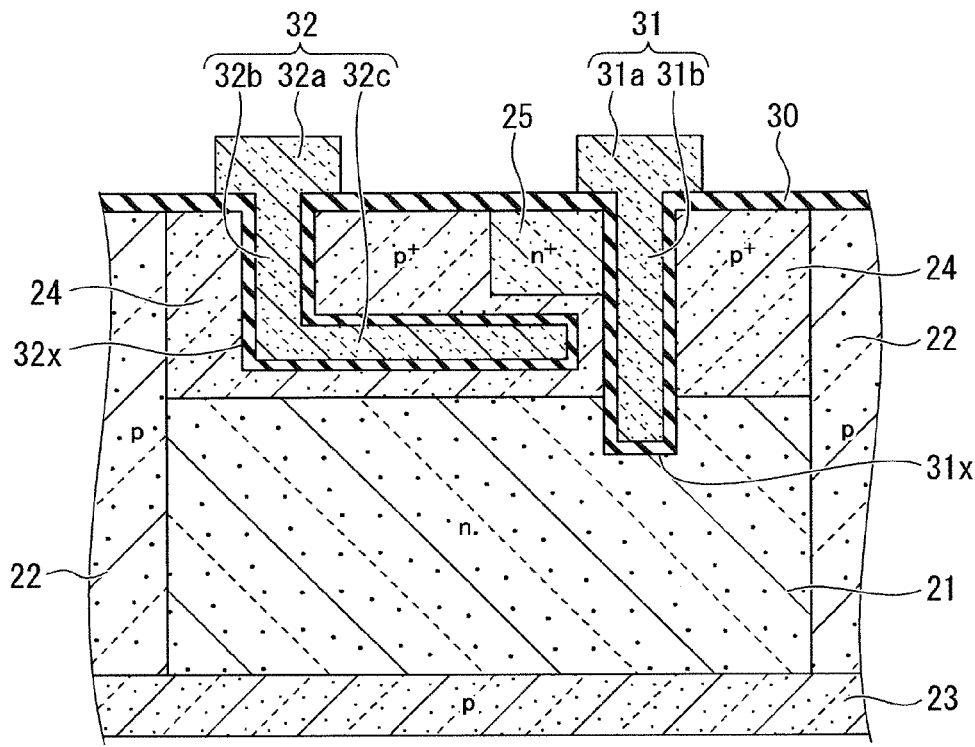
FIG. 15 is a sectional view following FIG. 14 of the method of manufacturing the pixel according to the first embodiment.

Next, as illustrated in FIG. 14, the gate insulating film 30 is formed on the front surfaces of the trenches 31x and 32x, the well region 24, the floating diffusion region 25, and the element isolation region 22 by the thermal oxidation method or the like. Next, polysilicon doped with impurities at a high concentration is embedded in the trenches 31x and 32x with the gate insulating film 30 interposed therebetween by the CVD method or the like. Thereafter, a part of polysilicon is selectively removed by using the photolithography technique and an etching technique to form the transfer gate electrode 31 and the auxiliary electrode 32 as illustrated in FIG. 15. At this time, the gate electrodes 33 to 35 illustrated in FIG. 2 are also formed.

Thereafter, a wiring layer is formed on the front surface side of the well region 24, the floating diffusion region 25, and the element isolation region 22 with an interlayer insulating film interposed therebetween by using the CVD method or the like. Furthermore, the light shielding film 42, the planarization film 41, the color filter 43, and the on-chip lens 44 are sequentially formed on the back surface side of the semiconductor region 23 by using the CVD method or the like. As a result, the pixel 2 illustrated in FIGS. 2 and 3 is completed.

Effects Produced by First Embodiment

In the solid-state imaging device according to the first embodiment, in a structure in which a photodiode which is a photoelectric converter is embedded (embedded photodiode structure), when signal charges are read, a positive potential is applied to the transfer transistor T1 to turn on the transfer transistor T1, and a voltage is locally applied by the auxiliary electrode 32. As a result, it is possible to improve a transfer failure by modulating the potential at a portion where the transfer failure is likely to occur by constricting the potential by the $p^+$-type well region 24. On the other hand, when the transfer transistor T1 has been turned off, the overflow barrier can be adjusted by applying a voltage by the auxiliary electrode 32, and the overflow barrier can be optimized. That is, instead of forming the diffusion region by ion implantation so as to minimize the influence on the potential around the auxiliary electrode 32, the auxiliary electrode 32 enables the potential to be adjusted with an arbitrary voltage to improve the transfer characteristics and the saturation characteristics.

Furthermore, since the control signals TRG1 and TRG2 are individually applied to the transfer gate electrode 31 and the auxiliary electrode 32, the potential of the control signal TRG2 applied to the auxiliary electrode 32 can be arbitrarily adjusted, and the timing of applying the control signal TRG2 can be shifted from the timing of applying the control signal TRG1. Therefore, by adjusting a bias of the control signal TRG2 and the timing of applying the control signal TRG2 while viewing an evaluation result, it is possible to find an optimum solution of the transfer and pumping (reverse flow) of the signal charges.

Second Embodiment

Figure 16:
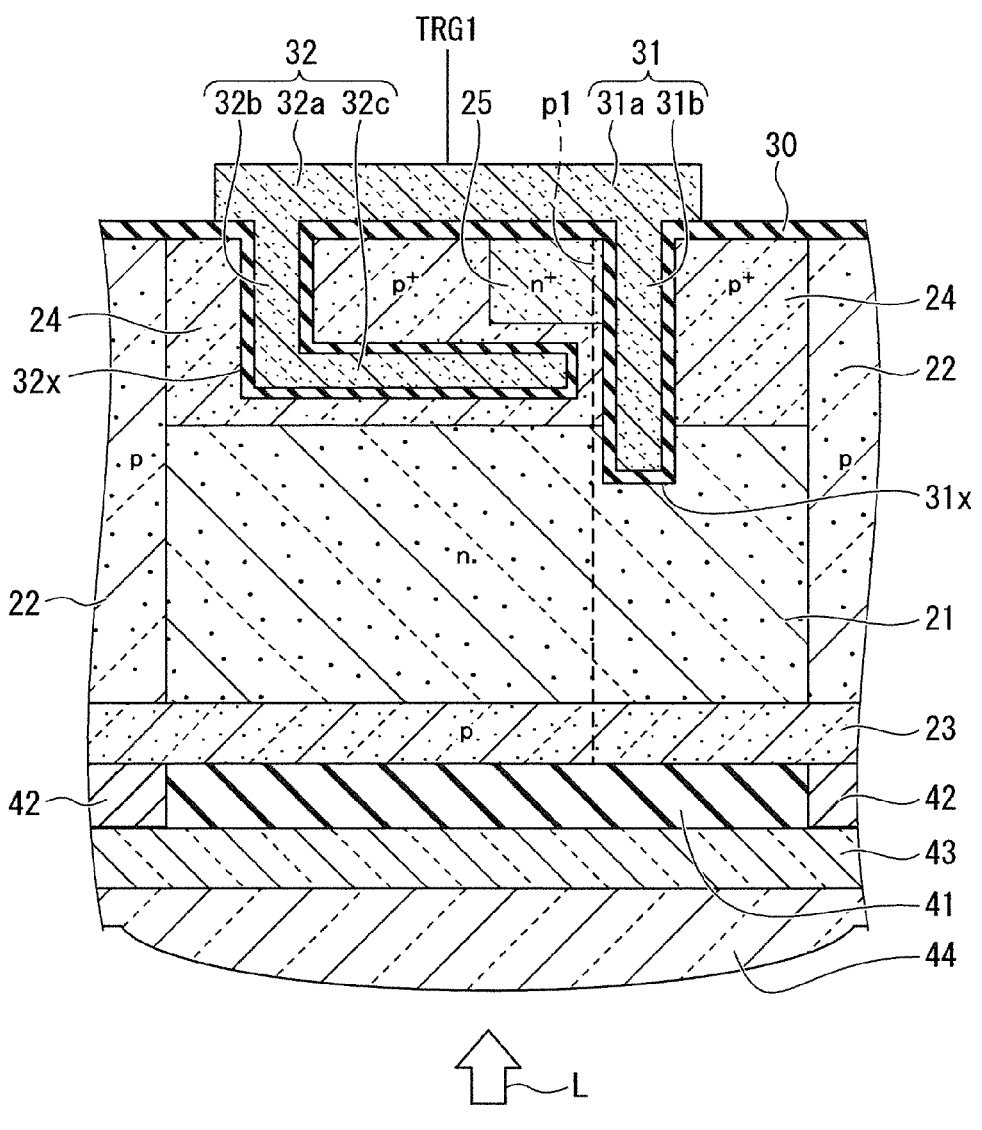
FIG. 16 is a sectional view of a pixel according to a second embodiment.

As illustrated in FIG. 16, the solid-state imaging device according to a second embodiment is different from the solid-state imaging device according to the first embodiment in that the transfer gate electrode 31 and the auxiliary electrode 32 are connected on the front surface side of the $p^+$-type well region 24. The protrusion 31a of the transfer gate electrode 31 and the protrusion 32a of the auxiliary electrode 32 are integrally formed. The control signal TRG1 common to the transfer gate electrode 31 is simultaneously applied to the auxiliary electrode 32. Since the other configurations of the solid-state imaging device according to the second embodiment are similar to those of the solid-state imaging device according to the first embodiment, redundant description will be omitted.

In the solid-state imaging device according to the second embodiment, since the transfer gate electrode 31 and the auxiliary electrode 32 are connected, the common control signal TRG1 can be simultaneously applied to the transfer gate electrode 31 and the auxiliary electrode 32. Therefore, the driving circuits of the transfer gate electrode 31 and the auxiliary electrode 32 are not individually prepared, and the transfer gate electrode 31 and the auxiliary electrode 32 can be operated by one common driving circuit.

Third Embodiment

Figure 17:
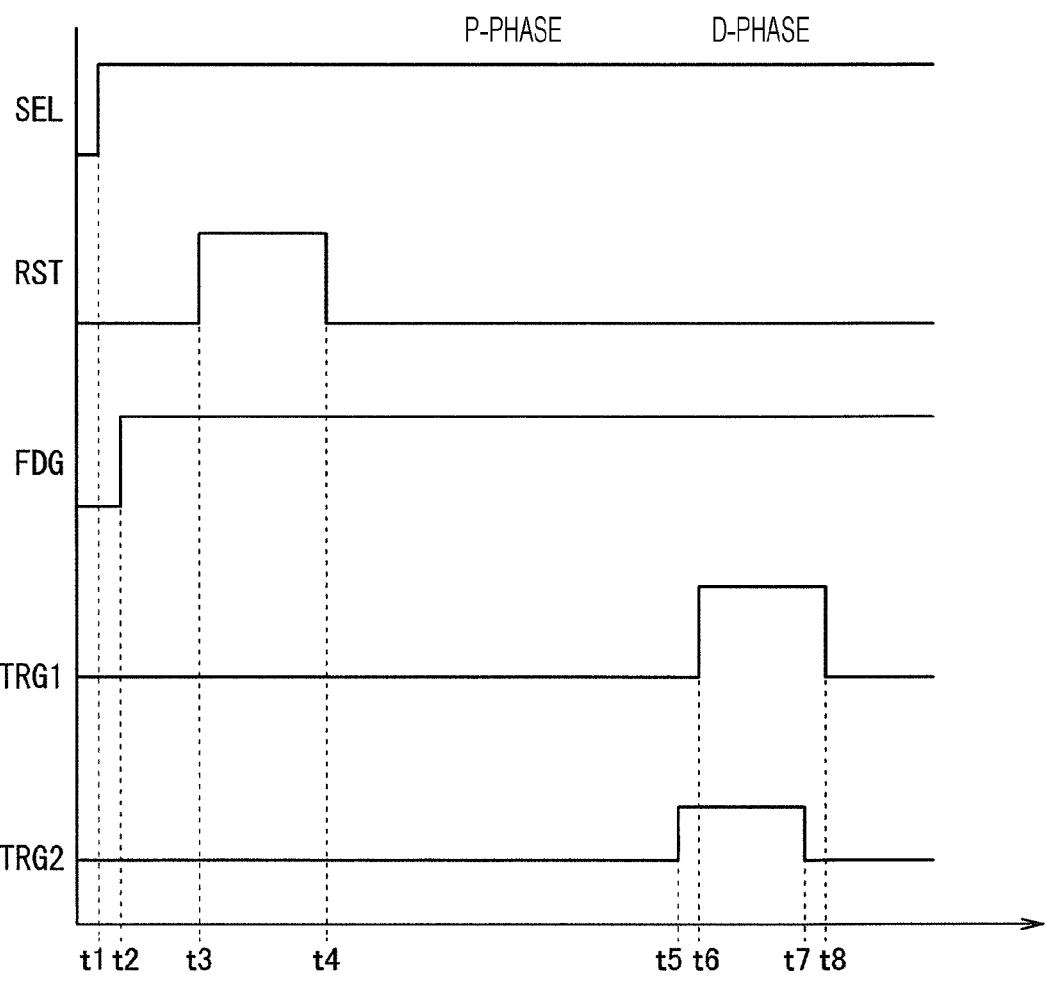
FIG. 17 is a timing chart of a read operation of a solid-state imaging device according to a third embodiment.

A solid-state imaging device according to a third embodiment has a structure similar to the structure of the solid-state imaging device according to the first embodiment, but as illustrated in a timing chart of FIG. 17, a read operation using the transfer gate electrode 31 and the auxiliary electrode 32 is different from the read operation of the solid-state imaging device according to the first embodiment.

Figure 7:
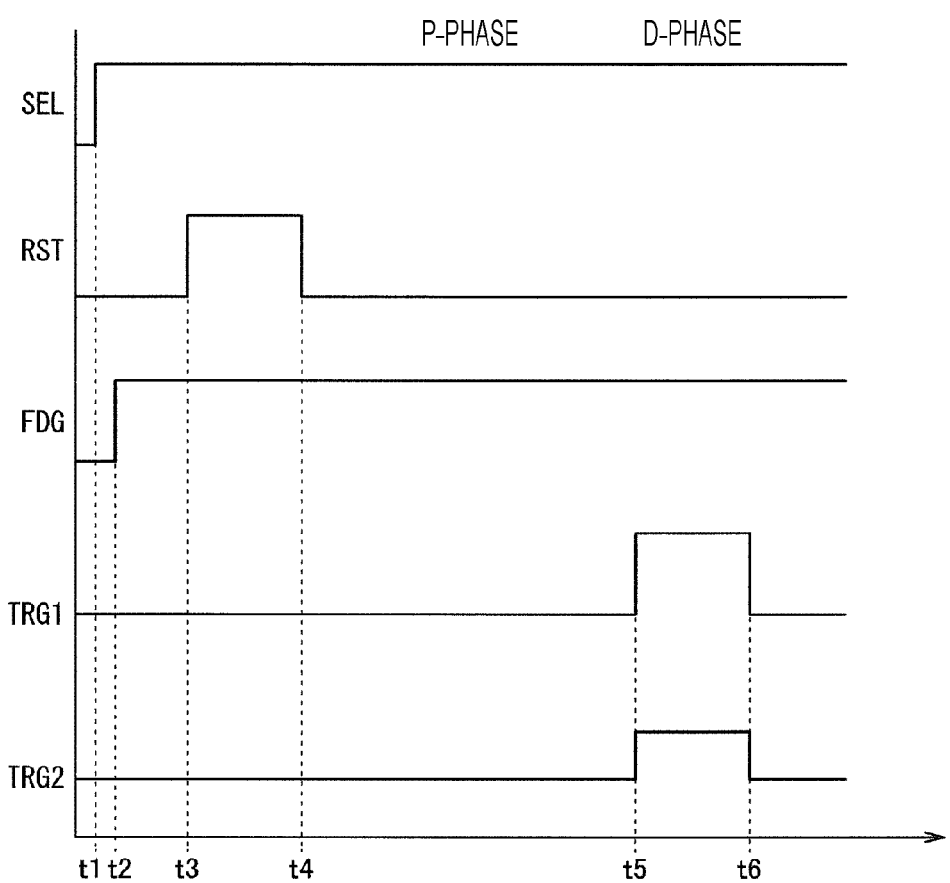
FIG. 7 is a timing chart of a read operation of the solid-state imaging device according to the first embodiment.

The operation from time t1 to t4 in FIG. 17 is similar to the operation as in the timing chart of the solid-state imaging device according to the first embodiment illustrated in FIG. 7. After the control signal TRG2 applied to the auxiliary electrode 32 is set to the H level at time t5 in FIG. 17, the control signal TRG1 applied to the transfer gate electrode 31 is set to the H level at time t6 to turn on the transfer transistor T1. Thereafter, the control signal TRG2 applied to the auxiliary electrode 32 is set to a low (L) level at time t7, and then, the control signal TRG1 applied to the transfer gate electrode 31 is set to the L level at time t6 to turn off the transfer transistor T1. Since the other configurations of the solid-state imaging device according to the third embodiment are similar to those of the solid-state imaging device according to the first embodiment, redundant description will be omitted.

In the solid-state imaging device according to the third embodiment, the timing of applying the control signal TRG2 to the auxiliary electrode 32 is made earlier than the timing of applying the control signal TRG1 to the transfer gate electrode 31, and the control signal TRG2 is set to the L level prior to the control signal TRG1. Thus, the potential of the channel region can be raised before the transfer transistor is turned off, and the reverse flow (pumping) of the signal charges to the photoelectric conversion region 21 when the transfer transistor is turned off can be suppressed.

Fourth Embodiment

Figure 18:
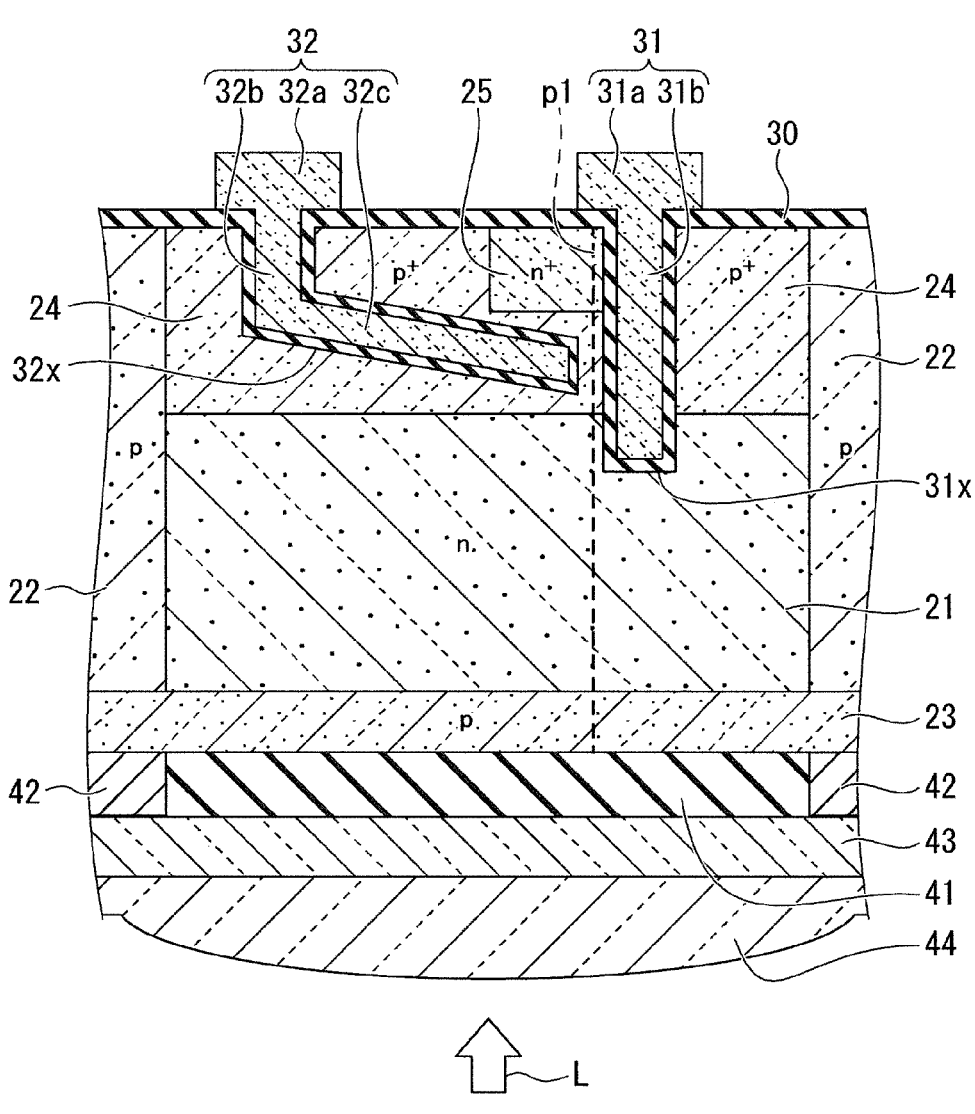
FIG. 18 is a sectional view of a pixel according to a fourth embodiment.

As illustrated in FIG. 18, a solid-state imaging device according to a fourth embodiment is different from the solid-state imaging device according to the first embodiment in the shape of an auxiliary electrode 32. The auxiliary electrode 32 includes the protrusion 32a, the first embedded region 32b, and the second embedded region 32c. The first embedded region 32b extends in the depth direction of the well region 24. One end of the second embedded region 32c is connected to an end in a depth direction of the first embedded region 32b. The second embedded region 32c extends in a direction oblique to the depth direction of the well region 24 so as to be deep toward the side surface of the embedded region 31b of the transfer gate electrode 31. Since the other configurations of the solid-state imaging device according to the fourth embodiment are similar to those of the solid-state imaging device according to the first embodiment, redundant description will be omitted.

In the solid-state imaging device according to the fourth embodiment, the second embedded region 32c of the auxiliary electrode 32 extends obliquely, and thus, an area ratio of an interface state can be reduced.

Fifth Embodiment

Figure 19:
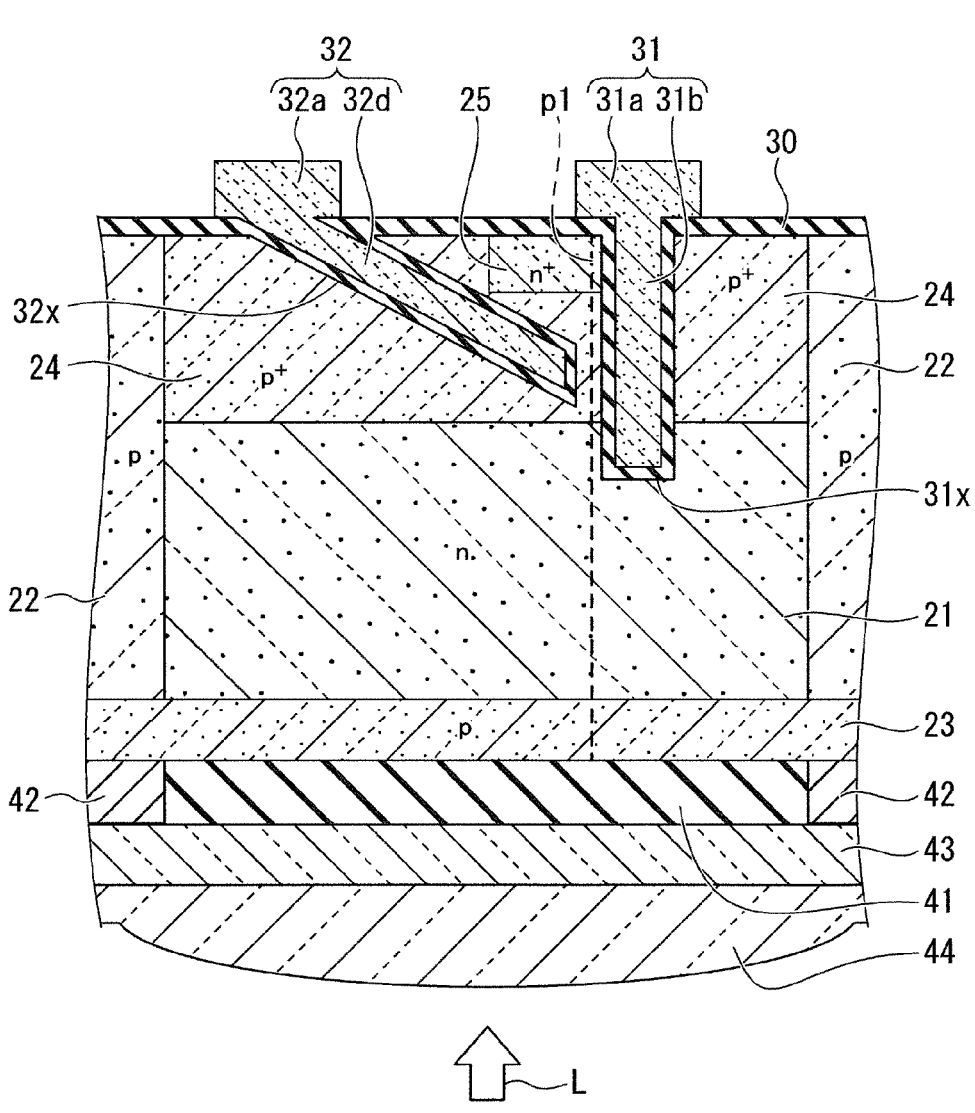
FIG. 19 is a sectional view of a pixel according to a fifth embodiment.

As illustrated in FIG. 19, a solid-state imaging device according to a fifth embodiment is different from the solid-state imaging device according to the first embodiment in the shape of an auxiliary electrode 32. The auxiliary electrode 32 includes the protrusion 32a and an embedded region 32d. One end of the embedded region 32d is connected to the protrusion 32a. The embedded region 32d extends in a direction oblique to the depth direction of the well region 24 so as to be deep toward the side surface of the embedded region 31b of the transfer gate electrode 31. When the embedded region 32d is formed, the trench 32x is only required to be obliquely dug by dry etching or the like without embedding an insulating film. Since the other configurations of the solid-state imaging device according to the fifth embodiment are similar to those of the solid-state imaging device according to the first embodiment, redundant description will be omitted.

In the solid-state imaging device according to the fifth embodiment, the embedded region 32d of the auxiliary electrode 32 extends obliquely, and thus, the area ratio of the interface state can be reduced.

Other Embodiments

The present technology has been described above according to the first to fifth embodiments, but it should not be understood that the description and drawings forming a part of this disclosure limit the present technology. It will be apparent to those skilled in the art that various alternative embodiments, examples, and operation techniques can be included in the present technology when understanding the spirit of the technical content disclosed in the above embodiments. Furthermore, the configurations disclosed in the first to fifth embodiments can be appropriately combined within a range in which no contradiction occurs.

Example of Application to Photodetector

The present technology can be applied to any photodetector including not only the above-described solid-state imaging device as an image sensor but also a ranging sensor also called a time of flight (ToF) sensor that measures a distance, and the like. The ranging sensor is a sensor that emits irradiation light toward an object, detects reflected light that is the irradiation light reflected off a surface of the object, and calculates a distance to the object on the basis of a flight time from the emission of the irradiation light to the reception of the reflected light. As a light receiving pixel structure of the ranging sensor, the above-described structure of the pixel 2 can be adopted.

<Example of Application to Electronic Apparatus>

Furthermore, the solid-state imaging device as described above can be applied to various electronic apparatuses such as an imaging system such as a digital still camera or a digital video camera, a mobile phone having an imaging function, or another device having an imaging function, for example.

Figure 20:
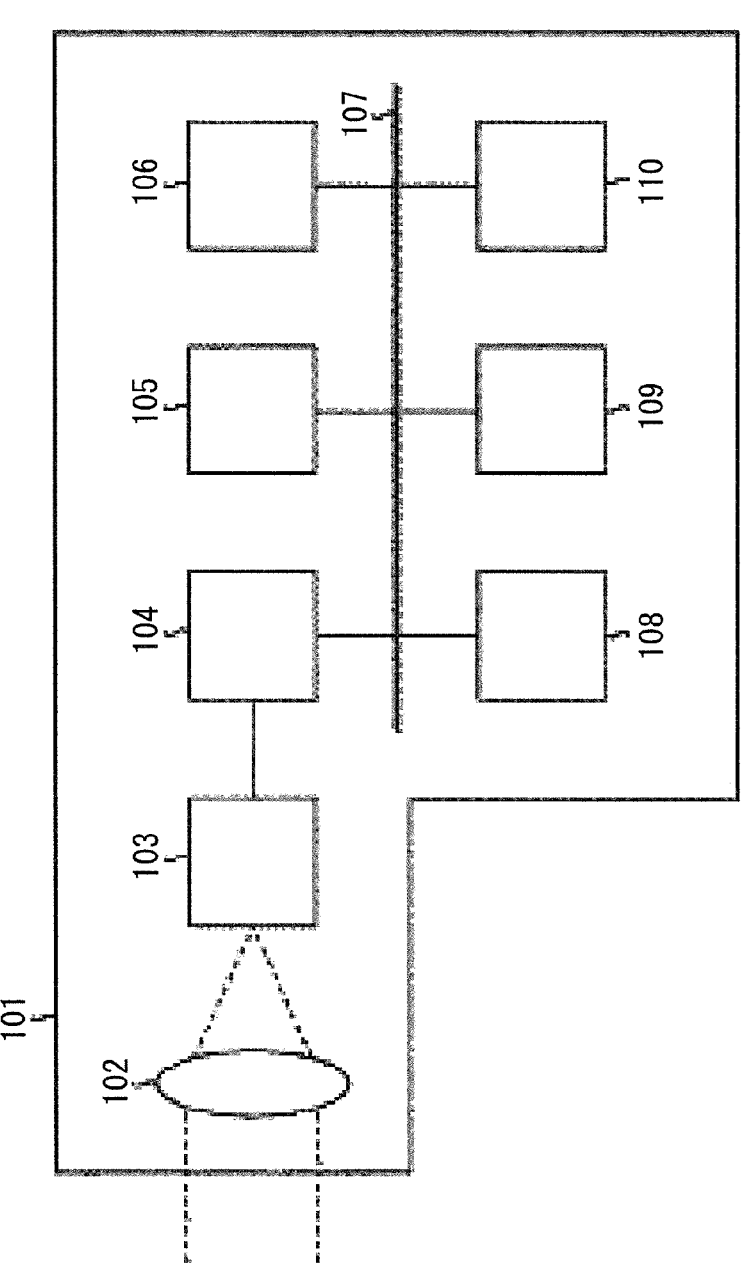
FIG. 20 is a block diagram illustrating a configuration example of an imaging device mounted on an electronic apparatus.

FIG. 20 is a block diagram illustrating a configuration example of an imaging device mounted on an electronic apparatus. As illustrated in FIG. 20, an imaging device 101 includes an optical system 102, an image pickup element 103, and a digital signal processor (DSP) 104, is configured by connecting the DSP 104, a display apparatus 105, an operation system 106, a memory 108, a recording device 109, and a power supply system 110 via a bus 107, and is capable of capturing a still image and a moving image.

The optical system 102 includes one or a plurality of lenses, and guides image light (incident light) from a subject to the image pickup element 103 to form an image on a light receiving surface (sensor unit) of the image pickup element 103.

As the image pickup element 103, the solid-state imaging device 1 of any of the above-described configuration examples is applied. Electrons are accumulated in the image pickup element 103 for a certain period in accordance with the image formed on the light receiving surface via the optical system 102. Then, a signal corresponding to the electrons accumulated in the image pickup element 103 is supplied to the DSP 104.

The DSP 104 performs various types of signal processing on the signal from the image pickup element 103 to acquire an image, and temporarily stores data of the image in the memory 108. The image data stored in the memory 108 is recorded in the recording device 109 or supplied to the display apparatus 105 to display the image. Furthermore, the operation system 106 receives various operations by a user and supplies an operation signal to each block of the imaging device 101, and the power supply system 110 supplies power necessary for driving each block of the imaging device 101.

<Example of Application to Endoscopic Surgery System>

The technology of the Present disclosure (present technology) can be applied to various products. For example, the technology of the present disclosure may be applied to an endoscopic surgery system.

Figure 21:
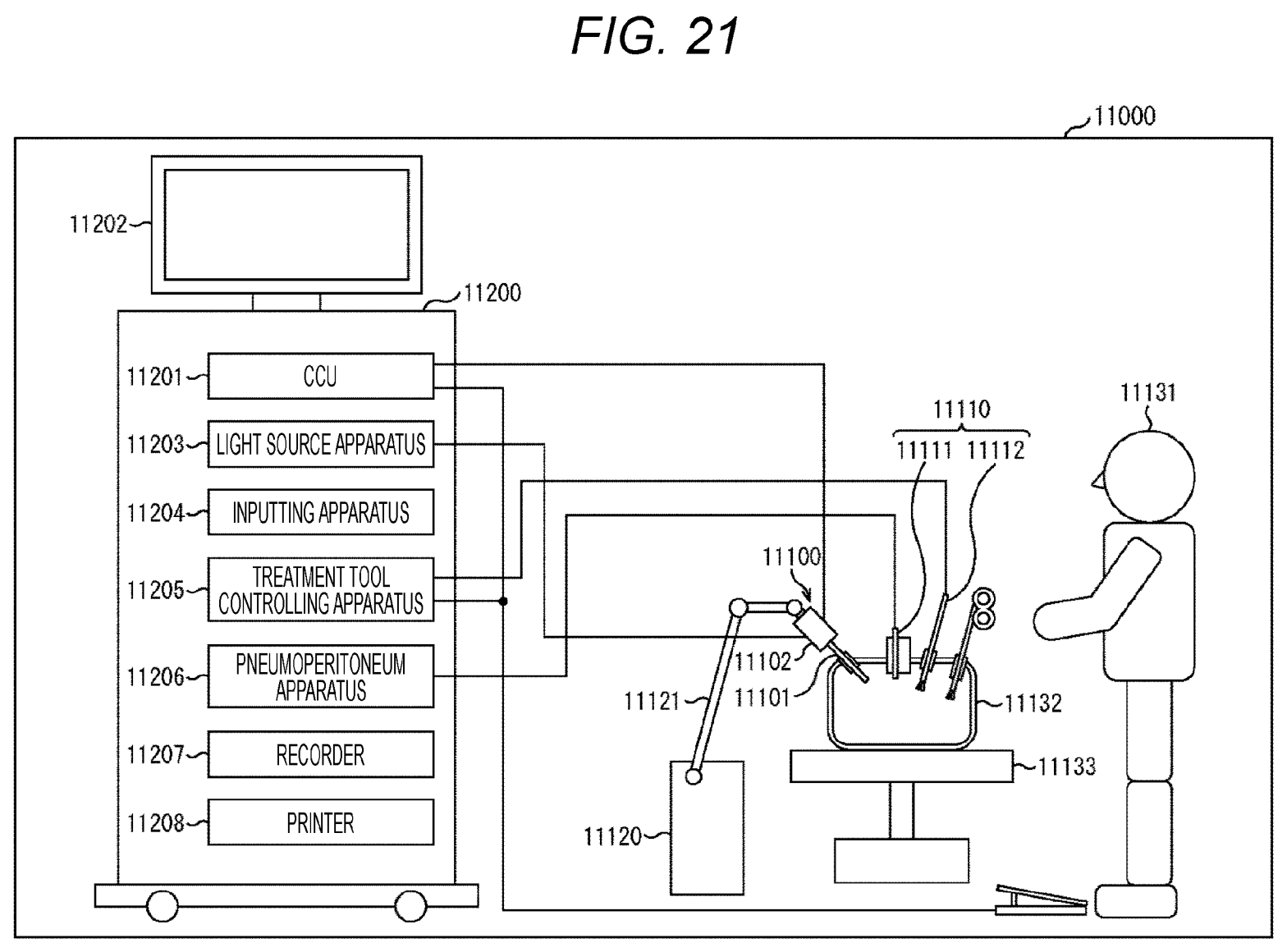

FIG. 21 is a diagram illustrating an example of a schematic configuration of an endoscopic surgery system to which the technology of the present disclosure (present technology) can be applied.

FIG. 21 illustrates a state in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumo-peritoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203.

Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 22:
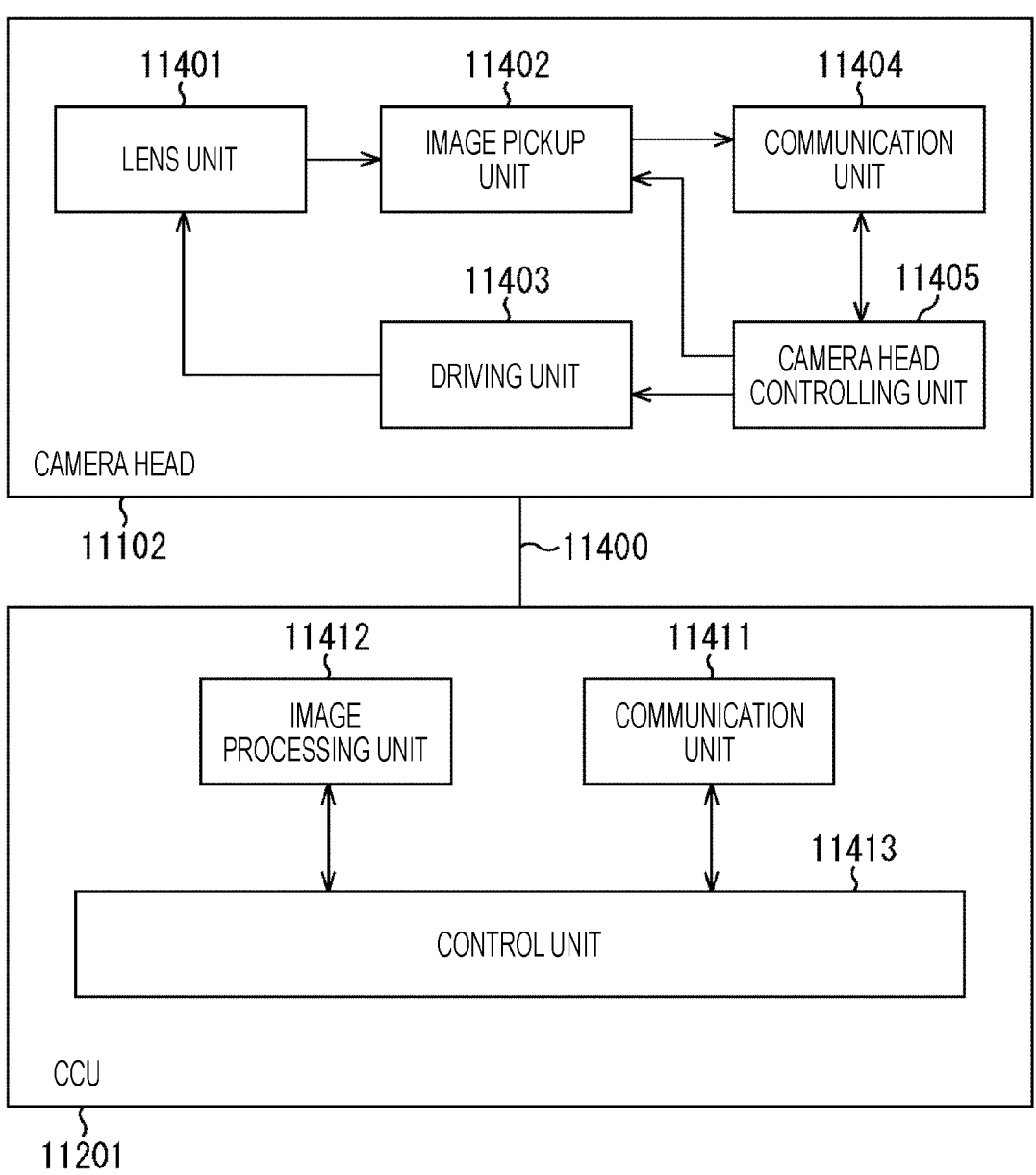
FIG. 22 is a block diagram illustrating an example of a functional configuration of a camera head and a camera control unit (CCU).

FIG. 22 is a block diagram illustrating an example of a functional configuration of the camera head 11102 and the CCU 11201 illustrated in FIG. 21.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology of the present disclosure can be applied has been described above. The technology of the present disclosure can be applied to the image pickup unit 11402 among the configurations described above. By applying the present technology to the image pickup unit 11402, for example, a clearer image of an operative site can be obtained, and the operator can reliably check the surgical site.

Note that, here, the endoscopic surgery system has been described as an example, but the technology of the present disclosure may be applied to, for example, a microscopic surgery system or the like.

<Example of Application to Mobile Body>

The technology of the present disclosure (present technology) can be applied to various products. For example, the technology of the present disclosure may be achieved as a device mounted on any type of mobile bodies such as an automobile, an electric car, a hybrid electric car, a motorcycle, a bicycle, personal mobility, an airplane, a drone, a ship, and a robot.

Figure 23:
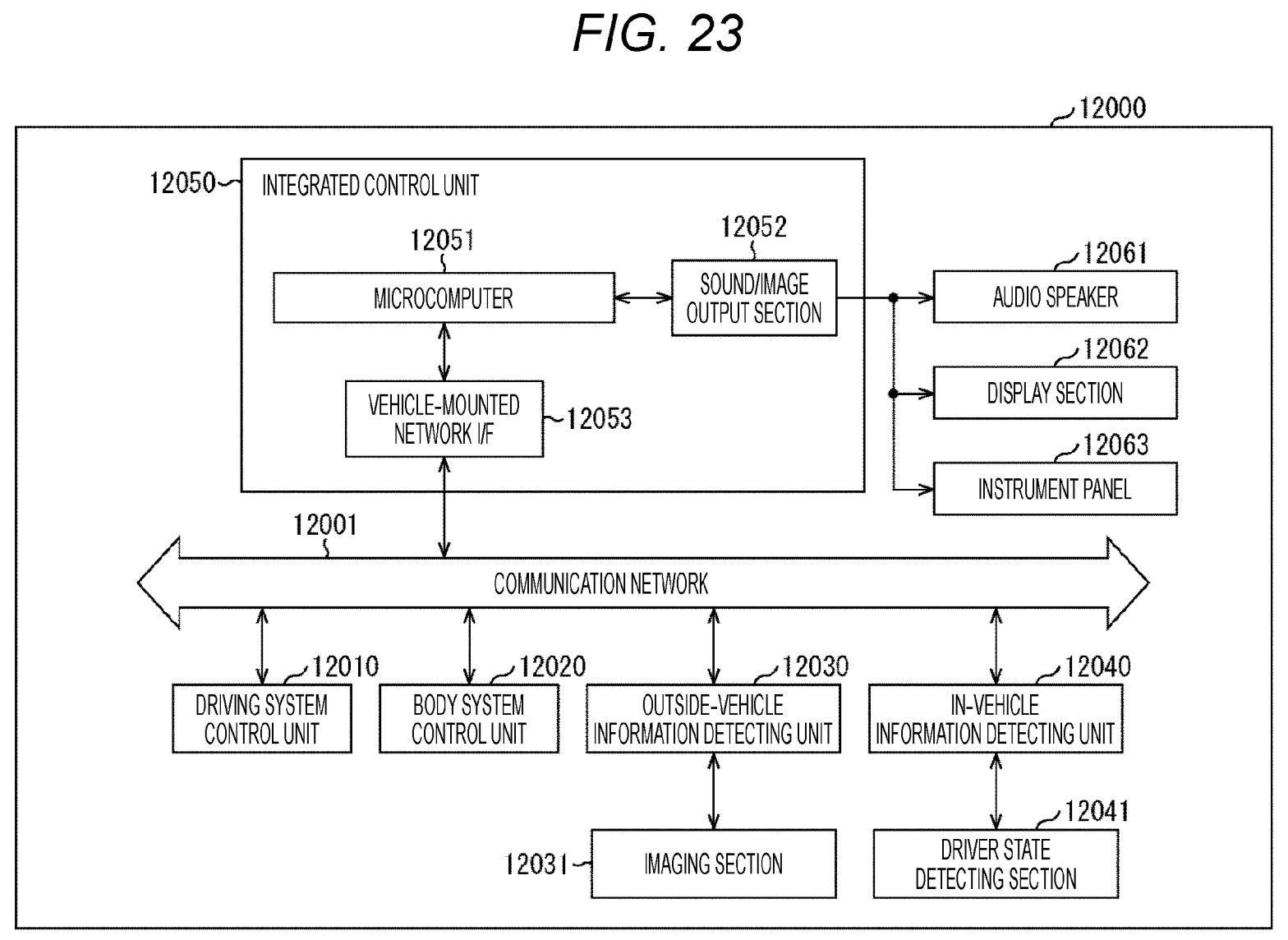

FIG. 23 is a block diagram illustrating a schematic configuration example of a vehicle control system which is an example of a mobile body control system to which the technology of the present disclosure can be applied.

The vehicle control system 12000 includes a plurality of electronic control units connected to each other via a communication network 12001. In the example depicted in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 23, an audio speaker 12061, a display section 12062, and an instrument panel 12063 are illustrated as the output device. The display section 12062 may, for example, include at least one of an on-board display and a head-up display.

Figure 24:
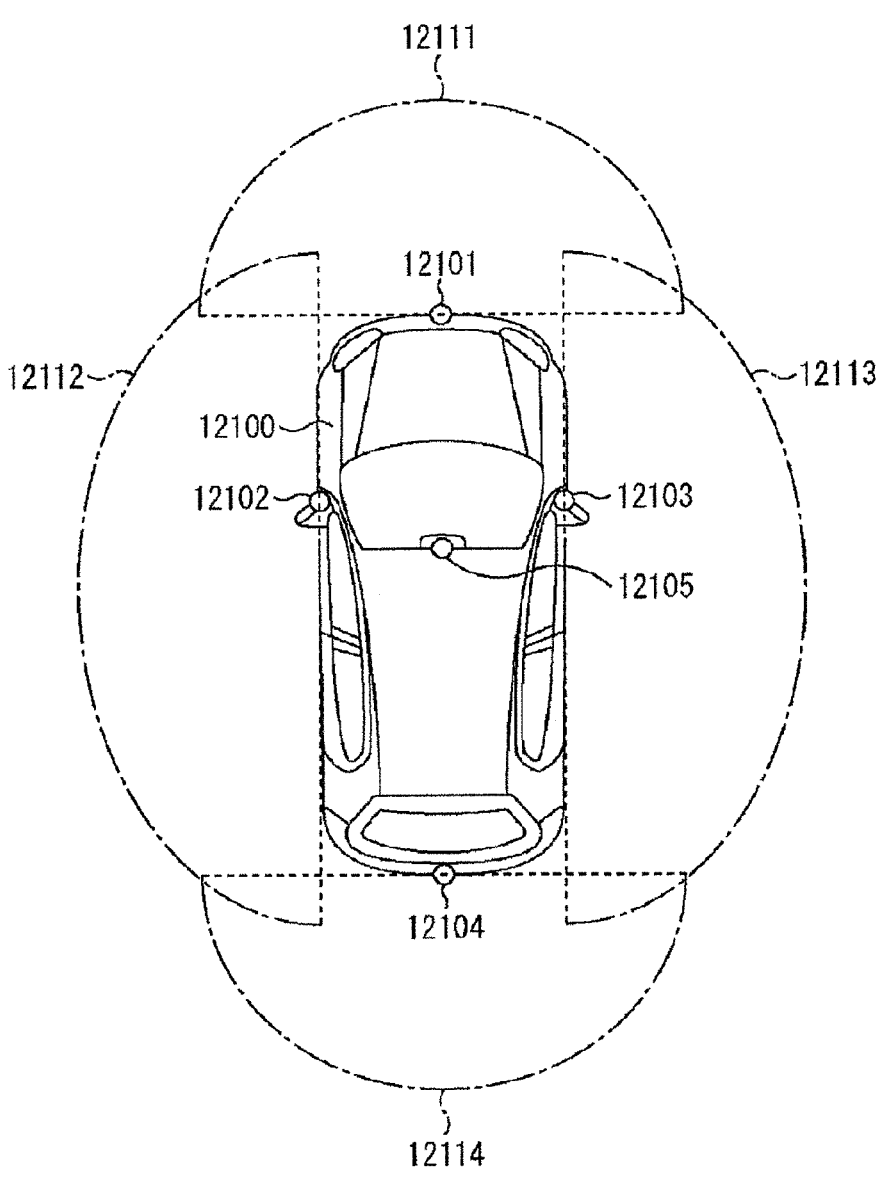
FIG. 24 is an explanatory view illustrating an example of installation positions of an outside-vehicle information detecting section and an imaging section.

FIG. 24 is a view illustrating an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 24 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied has been described above. The present technology can be applied to the imaging section 12031 among the configurations described above. By applying the technology of the present disclosure to the imaging section 12031, a more easily viewable captured image can be obtained, by which fatigue of the driver can be reduced.

Note that the present technology can also employ the following configurations.

(1)

A light receiving element includes a photoelectric conversion region of a first conductivity type, a well region of a second conductivity type provided on a side of one surface of the photoelectric conversion region, a floating diffusion region of the first conductivity type provided on a side of a one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

(2)

In the light receiving element according to (1), the auxiliary electrode includes a first embedded region extending in the depth direction of the well region, and a second embedded region connected to an end in a depth direction of the first embedded region and extending in a direction orthogonal to the depth direction toward the side surface of the transfer gate electrode.

(3)

In the light receiving element according to (1), the auxiliary electrode includes a first embedded region extending in the depth direction of the well region, and a second embedded region connected to an end in a depth direction of the first embedded region and extending in a direction oblique to the depth direction toward the side surface of the transfer gate electrode.

(4)

In the light receiving element according to (1), the auxiliary electrode includes an embedded region extending in a direction oblique to the depth direction of the well region toward the side surface of the transfer gate electrode.

(5)

In the light receiving element according to any of (1) to (4), the auxiliary electrode includes a protrusion protruding from the one surface of the well region.

(6)

In the light receiving element according to (5), the transfer gate electrode includes a protrusion protruding from the one surface of the well region, and the protrusion of the auxiliary electrode is apart from the protrusion of the transfer gate electrode.

(7)

In the light receiving element according to (5), the transfer gate electrode includes a protrusion protruding from the one surface of the well region, and the protrusion of the auxiliary electrode is connected to the protrusion of the transfer gate electrode.

(8)

In the light receiving element according to any of (1) to (6), potentials are applied to the transfer gate electrode and the auxiliary electrode independently of each other.

(9)

In the light receiving element according to any of (1) to (6) or (8), a potential applied to the auxiliary electrode is lower than a potential applied to the transfer gate electrode.

(10)

In the light receiving element according to any of (1) to (6), (8), or (9), a timing of stopping application of the potential to the auxiliary electrode is earlier than a timing of stopping application of the potential to the transfer gate electrode.

(11)

In the light receiving element according to any of (1) to (7), a common potential is simultaneously applied to the transfer gate electrode and the auxiliary electrode.

(12)

The light receiving element according to any of (1) to (11) further includes a pixel transistor provided on the side of the one surface of the well region.

(13)

A photodetector includes a pixel region including a plurality of pixels arranged in a matrix, in which each of the plurality of pixels includes a photoelectric conversion region of a first conductivity type, a well region of a second conductivity type provided on a side of one surface of the photoelectric conversion region, a floating diffusion region of a first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

(14)

An electronic apparatus includes a photodetector having a pixel region including a plurality of pixels arranged in a matrix, and a signal processing circuit that processes an output signal of the photodetector, in which each of the plurality of pixels includes a photoelectric conversion region of a first conductivity type, a well region of a second conductivity type provided on a side of one surface of the photoelectric conversion region, a floating diffusion region of a first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

(15)

A method of manufacturing a light receiving element includes forming a well region of a second conductivity type on a side of one surface of a photoelectric conversion region of a first conductivity type, forming a floating diffusion region of the first conductivity type on a side of one surface of a well region of the well region opposite to the photoelectric conversion region, embedding a transfer gate electrode that transfers a signal charge photoelectrically converted in the photoelectric conversion region to the floating diffusion region in a depth direction of the well region with a gate insulating film interposed therebetween, and embedding an auxiliary electrode that extends toward a side surface of the transfer gate electrode in the well region with the gate insulating film interposed therebetween.

(16)

In the method of manufacturing a light receiving element according to (15), the embedding the auxiliary electrode includes embedding an insulating film inside the well region, digging a trench exposing the insulating film in the depth direction of the well region, expanding the trench toward the side surface of the transfer gate electrode by removing the insulating film, and embedding the auxiliary electrode in the trench having been expanded with the gate insulating film interposed therebetween.

REFERENCE SIGNS LIST

1 Solid-state imaging device
2 Pixel (light receiving element)
3 Pixel region (imaging region)
4 Vertical drive circuit
5 Column signal processing circuit
6 Horizontal drive circuit
7 Output circuit
8 Control circuit
9 Vertical signal line
10 Horizontal signal line
11 Semiconductor substrate
12 Input/output terminal
20a Semiconductor substrate
20b Semiconductor layer
21 Photoelectric conversion region
22 Element isolation region
23 Semiconductor region
24 Well region
25 Floating diffusion region (floating diffusion)
26, 27, 28, 29 Diffusion region
30 Gate insulating film
31 Transfer gate electrode
31a Protrusion
31b Embedded region
31x Trench
32 Auxiliary electrode
32a Protrusion
32b First embedded region
32c Second embedded region
32d Embedded region
32x Trench
33, 34, 35 Gate electrode
41 Planarization film
42 Light shielding film
43 Color filter
44 On-chip lens (microlens)
51 Insulating film
52, 53 Photoresist film
101 Imaging device
102 Optical system
103 Image pickup element
104 DSP
105 Display apparatus
106 Operation system
107 Bus
108 Memory
109 Recording device
110 Power supply system
11000 Endoscopic surgery system
11100 Endoscope
11101 Lens barrel
11102 Camera head

11110 Surgical tool
11111 Pneumoperitoneum tube
11112 Energy device
11120 Supporting arm apparatus
11131 Surgeon (medical doctor)
11132 Patient
11133 Patient bed
11200 Cart
11202 Display apparatus
11203 Light source apparatus
11204 Inputting apparatus
11205 Treatment tool controlling apparatus
11206 Pneumoperitoneum apparatus
11207 Recorder
11208 Printer
11400 Transmission cable
11401 Lens unit
11402 Image pickup unit
11403 Driving unit
11404 Communication unit
11405 Camera head controlling unit
11411 Communication unit
11412 Image processing unit
11413 Control unit
12000 Vehicle control system
12001 Communication network
12010 Driving system control unit
12020 Body system control unit
12030 Outside-vehicle information detecting unit
12030 Body system control unit
12031 Imaging section
12040 In-vehicle information detecting unit
12041 Driver state detecting section
12050 Integrated control unit
12051 Microcomputer
12052 Sound/image output section
12061 Audio speaker
12062 Display section
12063 Instrument panel
12100 Vehicle
12101 Imaging section
12101, 12102, 12103, 12104, 12105 Imaging section
12111, 12112, 12113, 12114 Imaging range
FD Floating diffusion region (floating diffusion)
PD Photodiode
T1 Transfer transistor
T2 Conversion efficiency switching transistor
T3 Reset transistor
T4 Amplification transistor
T5 Selection transistor

The invention claimed is:

1. A light receiving element, comprising:
a photoelectric conversion region of a first conductivity type;
a well region of a second conductivity type provided on a side of one surface of the photoelectric conversion region;
a floating diffusion region of the first conductivity type provided on a side of a one surface of the well region opposite to the photoelectric conversion region;
a transfer gate electrode that is embedded in a depth direction of the well region with a gate insulating film interposed therebetween and transfers a signal charge photoelectrically converted in the photoelectric conversion region to the floating diffusion region; and an auxiliary electrode that is embedded in the well region with the gate insulating film interposed therebetween and extends toward a side surface of the transfer gate electrode.

2. The light receiving element according to claim 1, wherein the auxiliary electrode includes
a first embedded region extending in the depth direction of the well region, and
a second embedded region connected to an end in a depth direction of the first embedded region and extending in a direction orthogonal to the depth direction of the well region toward the side surface of the transfer gate electrode.

3. The light receiving element according to claim 1, wherein the auxiliary electrode includes
a first embedded region extending in the depth direction of the well region, and
a second embedded region connected to an end in a depth direction of the first embedded region and extending in a direction oblique to the depth direction of the well region toward the side surface of the transfer gate electrode.

4. The light receiving element according to claim 1, wherein the auxiliary electrode includes an embedded region extending in a direction oblique to the depth direction of the well region toward the side surface of the transfer gate electrode.

5. The light receiving element according to claim 1, wherein the auxiliary electrode includes a protrusion protruding from the one surface of the well region.

6. The light receiving element according to claim 5, wherein
the transfer gate electrode includes a protrusion protruding from the one surface of the well region, and
the protrusion of the auxiliary electrode is apart from the protrusion of the transfer gate electrode.

7. The light receiving element according to claim 5, wherein
the transfer gate electrode includes a protrusion protruding from the one surface of the well region, and
the protrusion of the auxiliary electrode is connected to the protrusion of the transfer gate electrode.

8. The light receiving element according to claim 1, wherein potentials are applied to the transfer gate electrode and the auxiliary electrode independently of each other.

9. The light receiving element according to claim 8, wherein a potential applied to the auxiliary electrode is lower than a potential applied to the transfer gate electrode.

10. The light receiving element according to claim 9, wherein a timing of stopping application of the potential to the auxiliary electrode is earlier than a timing of stopping application of the potential to the transfer gate electrode.

11. The light receiving element according to claim 1, wherein a common potential is simultaneously applied to the transfer gate electrode and the auxiliary electrode.

12. The light receiving element according to claim 1, further comprising a pixel transistor provided on the side of the one surface of the well region.

13. A photodetector, comprising:
a pixel region including a plurality of pixels arranged in a matrix, wherein each of the plurality of pixels includes
a photoelectric conversion region of a first conductivity type,
a well region of a second conductivity type provided on a side of one surface of the photoelectric conversion region, a floating diffusion region of the first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

14. An electronic apparatus, comprising:

a photodetector having a pixel region including a plurality of pixels arranged in a matrix; and a signal processing circuit that processes an output signal of the photodetector, wherein each of the plurality of pixels includes a photoelectric conversion region of a first conductivity type, a well region of a second conductivity type provided on a side of one surface of the photoelectric conversion region, a floating diffusion region of the first conductivity type provided on a side of one surface of the well region opposite to the photoelectric conversion region, a transfer gate electrode that is embedded in a depth direction of the well region with a gate insulating film interposed therebetween and transfers a signal charge photoelectrically converted in the photoelectric conversion region to the floating diffusion region, and an auxiliary electrode that is embedded in the well region with the gate insulating film interposed therebetween and extends toward a side surface of the transfer gate electrode.

15. A method of manufacturing a light receiving element, the method comprising:

forming a well region of a second conductivity type on a side of one surface of a photoelectric conversion region of a first conductivity type;

forming a floating diffusion region of the first conductivity type on a side of one surface of the well region opposite to the photoelectric conversion region;

embedding a transfer gate electrode that transfers a signal charge photoelectrically converted in the photoelectric conversion region to the floating diffusion region in a depth direction of the well region with a gate insulating film interposed therebetween; and embedding an auxiliary electrode that extends toward a side surface of the transfer gate electrode in the well region with the gate insulating film interposed therebetween.

16. The method of manufacturing the light receiving element according to claim 15, wherein the embedding the auxiliary electrode includes embedding an insulating film inside the well region, digging a trench exposing the insulating film in the depth direction of the well region, expanding the trench toward the side surface of the transfer gate electrode by removing the insulating film, and embedding the auxiliary electrode in the trench having been expanded with the gate insulating film interposed therebetween.

\* \* \* \* \*